US006928001B2

(12) United States Patent
Avni et al.

(10) Patent No.: US 6,928,001 B2
(45) Date of Patent: Aug. 9, 2005

(54) PROGRAMMING AND ERASING METHODS FOR A NON-VOLATILE MEMORY CELL

(75) Inventors: Dror Avni, Haifa (IL); Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 09/730,586

(22) Filed: Dec. 7, 2000

(65) Prior Publication Data

US 2004/0222437 A1 Nov. 11, 2004

(51) Int. Cl.$^7$ .............................................. G11C 16/06
(52) U.S. Cl. ........................... 365/185.22; 365/185.19; 365/185.28
(58) Field of Search ....................... 365/185.22, 185.19, 365/185.28, 185.01

(56) References Cited

U.S. PATENT DOCUMENTS

| 3,895,360 A | 7/1975 | Cricchi et al. |
| 4,016,588 A | 4/1977 | Ohya et al. |
| 4,017,888 A | 4/1977 | Christie et al. |

(Continued)

FOREIGN PATENT DOCUMENTS

| EP | 0751560 | 6/1995 |
| EP | 0693781 | 1/1996 |
| EP | 1073120 | 7/2000 |

(Continued)

OTHER PUBLICATIONS

Bude et al., "*EEPROM/Flash Sub 3.0V Drain–Source Bias Hot Carrier Writing*" IEDM 95, pp. 989–992.
Bude et al., "*Secondary Electron Flash—a High Performance, Low Power Flash Technology for 0.35 μm and Below*", IEDM 97, pp. 279–282.

(Continued)

*Primary Examiner*—Hoai Ho
(74) *Attorney, Agent, or Firm*—Eitan Law Group

(57) ABSTRACT

A method for programming and erasing a memory array includes the step of adapting programming or erase pulses to the current state of the memory array. In one embodiment, the step of adapting includes the steps of determining the voltage level of the programming pulse used to program a fast bit of the memory array and setting an initial programming level of the memory array to a level in the general vicinity of the programming level of the fast bit. For erasure, the method includes the steps of determining erase conditions of the erase pulse used to erase a slowly erasing bit of said memory array and setting initial erase conditions of said memory array to the general vicinity of said erase conditions of said slowly erasing bit. In another embodiment of the array, the step of adapting includes the steps of measuring the current threshold level of a bit to within a given range and selecting an incremental voltage level of a next programming or erase pulse for the bit in accordance with the measured current threshold level.

14 Claims, 20 Drawing Sheets

U.S. PATENT DOCUMENTS

| | | | |
|---|---|---|---|
| 4,151,021 | A | 4/1979 | McElroy |
| 4,173,766 | A | 11/1979 | Hayes |
| 4,173,791 | A | 11/1979 | Bell |
| 4,257,832 | A | 3/1981 | Schwabe et al. |
| 4,281,397 | A | 7/1981 | Neal et al. |
| 4,306,353 | A | 12/1981 | Jacobs et al. |
| 4,342,149 | A | 8/1982 | Jacobs et al. |
| 4,360,900 | A | 11/1982 | Bate |
| 4,380,057 | A | 4/1983 | Kotecha et al. |
| 4,388,705 | A | 6/1983 | Sheppard |
| 4,389,705 | A | 6/1983 | Sheppard |
| 4,471,373 | A | 9/1984 | Shimizu et al. |
| 4,521,796 | A | 6/1985 | Rajkanan et al. |
| 4,527,257 | A | 7/1985 | Cricchi |
| 4,586,163 | A | 4/1986 | Koike |
| 4,613,956 | A | 9/1986 | Paterson et al. |
| 4,630,085 | A | 12/1986 | Koyama |
| 4,667,217 | A | 5/1987 | Janning |
| 4,742,491 | A | 5/1988 | Liang et al. |
| 4,761,764 | A | 8/1988 | Watanabe |
| 4,769,340 | A | 9/1988 | Chang et al. |
| 4,780,424 | A | 10/1988 | Holler et al. |
| 4,847,808 | A | 7/1989 | Kobatake |
| 4,870,470 | A | 9/1989 | Bass, Jr. et al. |
| 4,916,671 | A | 4/1990 | Ichiguchi |
| 4,941,028 | A | 7/1990 | Chen et al. |
| 5,021,999 | A | 6/1991 | Kohda et al. |
| 5,042,009 | A * | 8/1991 | Kazerounian et al. . 365/185.16 |
| 5,075,245 | A | 12/1991 | Woo et al. |
| 5,104,819 | A | 4/1992 | Freiberger et al. |
| 5,117,389 | A | 5/1992 | Yiu |
| 5,159,570 | A | 10/1992 | Mitchell et al. |
| 5,168,334 | A | 12/1992 | Mitchell et al. |
| 5,172,338 | A | 12/1992 | Mehrotra et al. |
| 5,175,120 | A | 12/1992 | Lee |
| 5,204,835 | A | 4/1993 | Eitan |
| 5,214,303 | A | 5/1993 | Aoki |
| 5,241,497 | A | 8/1993 | Komarek |
| 5,260,593 | A | 11/1993 | Lee |
| 5,268,861 | A | 12/1993 | Hotta |
| 5,289,412 | A | 2/1994 | Frary et al. |
| 5,293,563 | A | 3/1994 | Ohta |
| 5,295,108 | A | 3/1994 | Higa |
| 5,305,262 | A | 4/1994 | Yoneda |
| 5,311,049 | A | 5/1994 | Tsuruta |
| 5,315,541 | A | 5/1994 | Harari et al. |
| 5,324,675 | A | 6/1994 | Hayabuchi |
| 5,338,954 | A | 8/1994 | Shimoji |
| 5,345,425 | A | 9/1994 | Shikatani |
| 5,349,221 | A | 9/1994 | Shimoji |
| 5,350,710 | A | 9/1994 | Hong et al. |
| 5,359,554 | A | 10/1994 | Odake et al. |
| 5,361,343 | A | 11/1994 | Kosonocky et al. |
| 5,375,094 | A | 12/1994 | Naruke |
| 5,393,701 | A | 2/1995 | Ko et al. |
| 5,394,355 | A | 2/1995 | Uramoto et al. |
| 5,399,891 | A | 3/1995 | Yiu et al. |
| 5,400,286 | A | 3/1995 | Chu et al. |
| 5,412,601 | A | 5/1995 | Sawada et al. |
| 5,414,693 | A | 5/1995 | Ma et al. |
| 5,418,176 | A | 5/1995 | Yang et al. |
| 5,418,743 | A | 5/1995 | Tomioka et al. |
| 5,422,844 | A | 6/1995 | Wolstenholme et al. |
| 5,424,567 | A | 6/1995 | Chen |
| 5,424,978 | A | 6/1995 | Wada et al. |
| 5,426,605 | A | 6/1995 | Van Berkel et al. |
| 5,434,825 | A | 7/1995 | Harari |
| 5,436,481 | A | 7/1995 | Egawa et al. |
| 5,440,505 | A | 8/1995 | Fazio et al. |
| 5,450,341 | A | 9/1995 | Sawada et al. |
| 5,450,354 | A | 9/1995 | Sawada et al. |
| 5,455,793 | A | 10/1995 | Amin et al. |
| 5,467,308 | A | 11/1995 | Chang et al. |
| 5,477,499 | A | 12/1995 | Van Buskirk et al. |
| 5,495,440 | A | 2/1996 | Asakura |
| 5,496,753 | A | 3/1996 | Sakurai et al. |
| 5,518,942 | A | 5/1996 | Shrivastava |
| 5,521,870 | A | 5/1996 | Ishikawa |
| 5,523,251 | A | 6/1996 | Hong |
| 5,523,972 | A | 6/1996 | Rashid et al. |
| 5,530,803 | A | 6/1996 | Chang et al. |
| 5,537,358 | A * | 7/1996 | Fong ........................ 365/218 |
| 5,553,018 | A | 9/1996 | Wang et al. |
| 5,563,823 | A | 10/1996 | Yiu et al. |
| 5,568,085 | A | 10/1996 | Eitan et al. |
| 5,583,808 | A | 12/1996 | Brahmbhatt |
| 5,592,417 | A | 1/1997 | Mirabel |
| 5,599,727 | A | 2/1997 | Hakozaki et al. |
| 5,606,523 | A | 2/1997 | Mirabel |
| 5,623,438 | A | 4/1997 | Guritz et al. |
| 5,636,288 | A | 6/1997 | Bonneville et al. |
| 5,644,531 | A | 7/1997 | Kuo et al. |
| 5,654,568 | A | 8/1997 | Nakao |
| 5,656,513 | A | 8/1997 | Wang et al. |
| 5,661,060 | A | 8/1997 | Gill et al. |
| 5,683,925 | A | 11/1997 | Irani et al. |
| 5,689,459 | A | 11/1997 | Chang et al. |
| 5,712,814 | A | 1/1998 | Fratin et al. |
| 5,715,193 | A | 2/1998 | Norman |
| 5,726,946 | A | 3/1998 | Yamagata et al. |
| 5,751,037 | A | 5/1998 | Aozasa et al. |
| 5,751,637 | A | 5/1998 | Chen et al. |
| 5,754,475 | A | 5/1998 | Bill et al. |
| 5,760,445 | A | 6/1998 | Diaz |
| 5,768,192 | A | 6/1998 | Eitan |
| 5,768,193 | A | 6/1998 | Lee et al. |
| 5,777,919 | A | 7/1998 | Chi-Yung et al. |
| 5,784,314 | A | 7/1998 | Sali et al. |
| 5,787,036 | A | 7/1998 | Okazawa |
| 5,793,079 | A | 8/1998 | Georgescu et al. |
| 5,801,076 | A | 9/1998 | Ghneim et al. |
| 5,812,449 | A | 9/1998 | Song |
| 5,812,456 | A | 9/1998 | Hull et al. |
| 5,812,457 | A | 9/1998 | Arase |
| 5,825,686 | A | 10/1998 | Schmitt-Landsiedel |
| 5,828,601 | A | 10/1998 | Hollmer et al. |
| 5,834,851 | A | 11/1998 | Ikeda et al. |
| 5,836,772 | A | 11/1998 | Chang et al. |
| 5,841,700 | A | 11/1998 | Chang |
| 5,847,441 | A | 12/1998 | Cutter et al. |
| 5,862,076 | A | 1/1999 | Eitan |
| 5,864,164 | A | 1/1999 | Wen |
| 5,870,334 | A * | 2/1999 | Hemink et al. ........ 365/185.17 |
| 5,870,335 | A | 2/1999 | Khan et al. |
| 5,886,927 | A | 3/1999 | Takeuchi |
| 5,892,710 | A | 4/1999 | Fazio et al. |
| 5,903,031 | A | 5/1999 | Yamada et al. |
| 5,926,409 | A | 7/1999 | Engh et al. |
| 5,933,367 | A | 8/1999 | Matsuo et al. |
| 5,946,258 | A | 8/1999 | Evertt et al. |
| 5,946,558 | A | 8/1999 | Hsu |
| 5,949,714 | A | 9/1999 | Hemink et al. |
| 5,949,728 | A | 9/1999 | Liu et al. |
| 5,963,412 | A | 10/1999 | En |
| 5,963,465 | A | 10/1999 | Eitan |
| 5,966,603 | A | 10/1999 | Eitan |
| 5,969,993 | A | 10/1999 | Takeshima |
| 5,973,373 | A | 10/1999 | Krautschneider et al. |
| 5,990,526 | A | 11/1999 | Bez et al. |
| 5,991,202 | A | 11/1999 | Derhacobian et al. |
| 5,999,444 | A | 12/1999 | Fujiwara et al. |

| | | |
|---|---|---|
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweer et al. |
| 6,063,666 A | 5/2000 | Chang et al. |
| 6,064,591 A | 5/2000 | Takeuchi et al. |
| 6,075,724 A | 6/2000 | Li et al. |
| 6,081,456 A | 6/2000 | Dadashev |
| 6,097,639 A | 8/2000 | Choi et al. |
| 6,108,241 A | 8/2000 | Chevallier |
| 6,118,692 A | 9/2000 | Banks |
| 6,128,226 A | 10/2000 | Eitan et al. |
| 6,134,156 A | 10/2000 | Eitan |
| 6,137,718 A | 10/2000 | Reisinger |
| 6,147,904 A | 11/2000 | Liron |
| 8,147,904 | 11/2000 | Liron |
| 6,157,570 A | 12/2000 | Nachumovsky |
| 6,163,048 A | 12/2000 | Hirose et al. |
| 6,169,691 B1 | 1/2001 | Pasotti et al. |
| 6,175,523 B1 | 1/2001 | Yang et al. |
| 6,181,605 B1 | 1/2001 | Hollmer et al. |
| 6,188,613 B1 * | 2/2001 | Manning .............. 365/185.33 |
| 6,192,445 B1 | 2/2001 | Rezvani |
| 6,201,282 B1 | 3/2001 | Eitan |
| 6,205,056 B1 | 3/2001 | Pan et al. |
| 6,215,148 B1 | 4/2001 | Eitan |
| 6,215,702 B1 | 4/2001 | Derhacobian et al. |
| 6,218,695 B1 | 4/2001 | Nachumovsky |
| 6,222,768 B1 | 4/2001 | Hollmer et al. |
| 6,240,032 B1 | 5/2001 | Fukumoto |
| 6,240,040 B1 | 5/2001 | Akaogi et al. |
| 6,256,231 B1 | 7/2001 | Lavi et al. |
| 6,266,281 B1 | 7/2001 | Derhacobian et al. |
| 6,272,047 B1 | 8/2001 | Mihnea et al. |
| 6,282,145 B1 | 8/2001 | Tran et al. |
| 6,285,574 B1 | 9/2001 | Eitan |
| 6,285,589 B1 | 9/2001 | Kajitani |
| 6,292,394 B1 * | 9/2001 | Cohen et al. .......... 365/185.03 |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,330,192 B1 | 12/2001 | Ohba et al. |
| 6,331,950 B1 | 12/2001 | Kuo et al. |
| 6,343,033 B1 | 1/2002 | Parker |
| 6,348,711 B1 | 2/2002 | Eitan |
| 6,396,741 B1 | 5/2002 | Bloom et al. |
| 6,426,898 B1 | 7/2002 | Mihnea et al. |
| 6,438,031 B1 | 8/2002 | Fastow |
| 6,442,074 B1 | 8/2002 | Hamilton et al. |
| 6,445,030 B1 | 9/2002 | Wu et al. |
| 6,490,204 B2 | 12/2002 | Bloom et al. |
| 6,512,701 B1 | 1/2003 | Hamilton et al. |
| 6,519,182 B1 | 2/2003 | Derhacobian et al. |
| 6,522,585 B2 | 2/2003 | Pasternak |
| 6,552,387 B1 | 4/2003 | Eitan |
| 6,567,303 B1 | 5/2003 | Hamilton et al. |
| 6,567,312 B1 | 5/2003 | Torii et al. |
| 6,584,017 B2 | 6/2003 | Maayan et al. |
| 6,590,811 B1 | 7/2003 | Hamilton et al. |
| 6,618,290 B1 | 9/2003 | Wang et al. |
| 6,639,844 B1 | 10/2003 | Liu et al. |
| 6,639,849 B2 | 10/2003 | Takahashi et al. |
| 6,643,177 B1 | 11/2003 | Le et al. |
| 6,643,181 B2 | 11/2003 | Sofer et al. |
| 6,665,769 B2 | 12/2003 | Cohen et al. |
| 6,690,602 B1 | 2/2004 | Le et al. |
| 2002/0064911 A1 | 5/2002 | Eitan |
| 2002/0132436 A1 | 9/2002 | Ellyahu et al. |
| 2002/0191465 A1 | 12/2002 | Maayan et al. |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0142544 A1 | 7/2003 | Maayan et al. |
| 2003/0156456 A1 | 8/2003 | Shappir et al. |
| 2003/0206435 A1 | 11/2003 | Takahashi |
| 2003/0218913 A1 | 11/2003 | Le et al. |
| 2003/0227796 A1 | 12/2003 | Miki et al. |
| 2004/0027858 A1 | 2/2004 | Takahashi et al. |

FOREIGN PATENT DOCUMENTS

| | | |
|---|---|---|
| GB | 1297899 | 10/1970 |
| GB | 2157489 | 3/1984 |
| JP | 05021758 | 7/1991 |
| JP | 04226071 | 8/1992 |
| JP | 04291962 | 10/1992 |
| JP | 07193151 | 12/1993 |
| JP | 07193151 | 7/1995 |
| JP | 09162314 | 12/1995 |
| JP | 09162314 | 6/1997 |
| JP | 11162182 | 6/1999 |
| WO | WO 81/00790 | 9/1979 |
| WO | WO 96/25741 | 2/1995 |
| WO | WO 96/15553 | 5/1996 |
| WO | WO 99/31670 | 6/1999 |
| WO | WO 02/43073 | 5/2002 |
| WO | WO 03/063167 | 7/2003 |
| WO | WO 03/079370 | 9/2003 |
| WO | WO 03/088258 | 10/2003 |
| WO | WO 03/088259 | 10/2003 |
| WO | WO 03/088260 | 10/2003 |
| WO | WO 03/100790 | 12/2003 |

OTHER PUBLICATIONS

Bude et al., "*Modeling Nonequilibrium Hot Carrier Device Effects*", Conferences of Insulator Specialists of Europe, Sweden, Jun., 1997.

Jung et al., "*A 117–mm² 3.3V Only 128–Mb Multilevel NAND Flash Memory for Mass Storage Applications*" IEEE Journal of Solid–State Circuits, vol. 31, No. 11, Nov. 1996, pp. 1575–1583.

Campardo et al., "*40mm² 3–V–Only 50 MHz 64–Mb 2–b/cell CHE NOR Flash Memory*", IEEE Journal of Solid–State Circuits, vol. 35, No. 11, Nov. 2000, pp. 1655–1667.

Lin et al., "*Novel Source–Controlled Self–Verified Programming for Multilevel EEPROM's*", IEEE Transactions on Electron Devices, vol. 47, No. 6, Jun. 2000, pp. 1166–1174.

Eitan, U.S. Appl. No. 08/902,890, filed Jul. 30, 1997.

U.S. Appl. No. 09/082,280, filed May 20, 1998, Eitan.

U.S. Appl. No. 09/348,720, filed Jul. 6, 1999, Eitan.

U.S. Appl. No. 09/413,408, filed Oct. 6, 1999, Eitan.

U.S. Appl. No. 09/536,125, filed Mar. 28, 2000, Eitan.

Chan et al., "A True Single–Transistor Oxide–Nitride–Oxide EEPROM Device," *IEEE Electron Device Letters*, vol. EDL–8, No. 3, Mar. 1987.

Change, J., "Non Volatile Semiconductor Memory Devices," *Proceedings of the IEEE*, vol. 64 No. 7, Issued Jul. 1976.

Etian et al., "Hot–Electron Injection into the Oxide in n–Channel MOS Devices," *IEEE Transactions on Electron Devices*, vol. ED–38, No. 3, pp. 328–340, Mar. 1981.

Glasser et al., "The Design and Analysis of VLSI Circuits," Addison Wesley Publishing Co, Chapter 2, 1988.

Lee, H., "A New Approach For the Floating–Gate Mos NonVolatile Memory", *Applied Physics Letters,* vol. 31, No. 7, pp. 475–476, Oct. 1977.

Ma et al., "A dual–bit Split–Gate EEPROM (DSG) Cell in Contactless Array for Single–Vcc High Density Flash Memories," *IEEE,* pp. 3.5.1–3.5.4, 1994.

Oshima et al., "Process and Device Technologies for 16Mbit Eproms with Large—Tilt—Angle implantedP–Pocket Cell," *IEEE,* CH2865–4/90/000–0095, pp. 5.2.1–5.2.4, 1990.

Roy, Anariban "Characterization and Modeling of Charge Trapping and Retention in Novel Multi–Dielectic Nonvolatile Semiconductor Memory Device," Doctoral Dissertation, Sherman Fairchild Center, Department of Computer Science and Electrical Engineering, pp. 1–35, 1989.

"2 Bit/Cell EEPROM Cell Using Band–To–Band Tunneling For Data Read–Out," *IBM Technical Disclosure Bulletin,* U.S. IBM Corp. NY vol. 35, No. 4B, ISSN:0018–8689, Sep., 1992.

Hsing–Huang Tsent et al. "Thin CVD Gate Dielectric for ULSI Technology", *IEEE,* 0–7803–1450–6, 1993.

Pickar, K.A., "Ion Implantation in Silicon," *Applied Solid State Science,* vol. 5, R. Wolfe Edition, Academic Press, New York, 1975.

Bhattacharyya et al., "FET Gate Structure for Nonvolatile N–Channel Read–Mostly Memory Device," *IBM Technical Disclosure Bulletin,* U.S. IBM Corp. vol. 18, No. 6, p. 1768, 1976.

U.S. Appl. No. 08/905,286, filed Aug. 1, 1997, Eitan.

Bruno Ricco, "Nonvolatile Multilevel Memories for Digital Application", IEEE, vol. 86, No. 12, issued Dec. 1998, pp. 2399–2421.

Bude et al. "EEPROM/Flash Sub 3.0V drain –Source Bias Hot Carrier Writing", IEDM, 1995, pp. 989–991.

Bude et al. "Modeling Nonequilibrium Hot Carrier Device Effects Conference of Insulator Specialists of Europe", Jun., 1997.

Ricco et al., "Nonvolatile Multilevel Memories for Digital Applications Proceedings of the IEEE", vol. 86, No. 12 Institute of Electrical and Electronics Engineers, Inc., Dec. 1998, pp. 2399–2421.

European Search Report for EP 03001943. U.S. Appl. No. 08/905,286.

* cited by examiner

PROGRAMMING AND ERASING METHODS FOR A NON-VOLATILE MEMORY CELL

FIELD OF THE INVENTION

The present invention relates generally to electrically erasable, programmable read only memory (EEPROM) cells and specifically, to methods for programming thereof.

BACKGROUND OF THE INVENTION

FIG. 1, to which reference is made, illustrates a typical prior art floating gate cell, comprising two diffusion areas, source 102 and drain 104, embedded in a substrate 105, between which is a channel 100. A floating gate 101 is located above but insulated from channel 100, and a gate 112 is located above but insulated from floating gate 101.

Typically, when programming the floating gate cell, programming voltages $V_G$ and $V_D$ are applied to gate 101 and drain 104, respectively, and a low source voltage $V_S$ is applied to source 102. For array applications, a row of gates are formed into a word line, and a column of drain and source are formed into bit lines along which voltages $V_D$ and $V_S$, respectively, are supplied.

The source and drain voltages $V_S$ and $V_D$, respectively, create a lateral field that pulls channel electrons from source 102 to drain 104. This is indicated by arrow 10. Near drain 104, a vertical field created by the gate voltage $V_G$ allows hot channel electrons to be injected (arrow 12) into floating gate 101. Once injected into floating gate 101, the electrons are distributed equally across the entire gate, increasing the threshold voltage $V_{TH}$ of gate 101.

Another type of non-volatile cell is the nitride, read only memory (NROM) cells are described in Applicant's copending U.S. patent application Ser. No. 08/905,286, entitled "Two Bit Non-Volatile Electrically Erasable And Programmable Semiconductor Memory Cell Utilizing Asymmetrical Charge Trapping" which was filed Aug. 1, 1997. The disclosure of the above-identified application is incorporated herein by reference.

Similar to the floating gate cell of FIG. 1, the NROM cell illustrated in FIGS. 2A and 2B, to which reference is now made, has channel 100 between two diffusion areas 102 and 104. However, unlike the floating gate cell, the NROM cell has two separated and separately chargeable areas 106 and 108. Each chargeable area defines one bit. For the dual bit cell of FIGS. 2, the separately chargeable areas 106 and 108 are found within a nitride layer 110 formed in an oxide-nitride-oxide (ONO) sandwich (layers 109, 110 and 111) underneath gate 112.

To program the left bit in area 106, the left diffusion area 102 receives the high programming voltage $V_D$ (i.e. area 102 the drain) and right diffusion area 104 is grounded (i.e. area 104 the source). Hence the electrons flow from area 104 to area 102. This is indicated by arrow 114. The channel hot electrons are then injected into the nitride layer, in area 106. The negative charge in area 106 raise the threshold voltage of the cell, if read in the reverse direction.

The opposite is true for programming area 108; the left diffusion area 102 is the source (i.e. grounded) and right diffusion area 104 is the drain (i.e. receives high programming voltage $V_D$). The cell is therefore programmed in the opposite direction, as indicated by arrow 113, and the electrons then jump up into chargeable area 108.

For NROM cells, each bit is read in the direction opposite (a "reverse read") to that of its programming direction. An explanation of the reverse read process is described in U.S. patent application Ser. No. 08/905,286, mentioned above. Thus, to read the left bit stored in area 106, right diffusion area 104 is the drain and left diffusion area 102 is the source. This is known as the "read through" direction, indicated by arrow 113. To read the right bit stored in area 108, the cell is read in the opposite direction, indicated by arrow 114. Thus, left diffusion area 102 is the drain and right diffusion area 104 is the source.

During the read operation, the presence of the gate and drain voltages $V_G$ and $V_D$, respectively, induce a depletion layer 54 (FIG. 2B) and an inversion layer 52 in the center of channel 100. The drain voltage $V_D$ is large enough to induce a depletion region 55 near drain 104 which extends to the depletion layer 54 of channel 100. This is known as "barrier lowering" and it causes "punch-through" of electrons from the inversion layer 52 to the drain 104.

Since area 106 is near left diffusion area 102 which, for this case, acts as the source (i.e. low voltage level), the charge state of area 106 will determine whether or not the inversion layer 52 is extended to the source 102. If enough electrons are trapped in left area 106, then the voltage thereacross will not be sufficient to extend inversion layer 52 to the source 102, the cells current will be low, and a "0" will be read. The opposite is true if area 106 has no charge.

Reference is now made to FIGS. 3A, 3B and 3C, which are timing diagrams of an exemplary prior art programming schedule for NROM cells. Typically, when programming an NROM cell, programming pulses 120A, 120B and 120C, consisting of programming voltages $V_D$, $V_S$, and $V_G$, respectively, are applied to the cell. Programming pulses 120 are then followed by program verify pulses 122A, 122B and 122C, consisting of read voltages $V_D$, $V_S$, and $V_G$, respectively, during which time the cell is read.

If there are enough electrons trapped in the bit, a "0" is read, and the cell is verified as programmed. If, however, during the read operation, the inversion layer is not strong enough to prevent the current flow through the channel, than the bit will be read as a "1", and the cell will fail program verification.

The sequence of pulses 120 and 122 are repeatedly applied until the effect of the charged trapped in area 106 (or 108) has reached the desired level and the cell is considered "programmed". The programming process is then terminated.

Due to ever demanding manufacturing requirements, the semiconductor industry is continuously searching for ways to improve the programming process. There exist two contradicting programming requirements; 1) to increase the programming speed, thereby reducing the cost of testing the part, and 2) to improve the control of the final programmed threshold, thereby enhancing product reliability.

The first requirement can easily be met just by increasing the drain and gate potentials to their maximum values. However, this strategy will not meet the second requirement due to many process and environmental parameters that affect the programming rate and its variations.

To achieve the second requirement, there are two basic options, controlling the length of the programming sequence, and/or stepping the amplitude of the gate voltage potential.

The article "Nonvolatile Multilevel Memories for Digital Applications", published in the *IEEE Magazine* on 12 Dec. 1998, discusses a number of proposed methods for programming multi-level floating gate circuits, including that of controlling the programming time length. One such method is discussed In the section *Programming and Accuracy*, 2) *Drain Voltage Programming*, as follows: 1) a constant gate voltage is set, 2) per bit level of the multi-level cell, a constant drain voltage is determined, and 3) the cell is programmed for a predetermined time period. At the completion of the time period, the programming is terminated. Alternately, the article describes an approach whereby after each programming pulse, the threshold voltage $V_{TH}$ is verified. Upon reaching the target threshold voltage, programming is terminated.

U.S. Pat. No. 5,523,972 describes a floating gate method that entails incrementally increasing the programming gate voltage $V_G$, while keeping other factors constant (e.g. source and drain voltages, $V_S$ and $V_D$, respectively). In the described programming algorithm, each cell is checked to determine whether or not it has reached the desired state. If not, a programming gate voltage pulse of a slightly higher voltage is applied to the cell. The charge level is checked again, and if the desired state has not yet been reached, the voltage is raised again and applied. This process is repeated until all the cells reach the desired level.

U.S. Pat. No. 5,172,338 describes a programming algorithm similar to that described in the U.S. Pat. No. 5,523,972, however, on a per cell basis. Every cell that reaches the desired level does not receive the drain voltage of the next step. This sequence is continued until the last bit of the byte word/group is programmed.

As explained in both "Nonvolatile Multilevel Memories for Digital Applications" and U.S. Pat. No. 5,523,972, in floating gate cells, the relationship between $\Delta V_G$ and $\Delta V_{TH}$ is linear. As such, control of programming is relatively precise since, for every change in the gate voltage $V_G$, there is a similar change in the threshold voltage $V_{TH}$ of the cell.

Nonetheless, there are many factors influencing the programming speed, and consequently, the programming speed may vary from cell to cell even when the same level of programming voltage is applied thereto. FIG. 4, to which reference is now made, illustrates the typical variation of programming time for a normal population of memory cells. Point 126 depicts the cell with the fastest programming speed, while point 128 represents the cell with the slowest programming speed. The variance in time between point 126 to point 128 can be as large as 500×.

The wide variation of programming speeds creates problems during programming of memory cell arrays. These arrays may contain many millions of memory cells, each with its own distinct programming speed. Some cells may reach their programmed level in a shorter time than needed for other cells to reach their programmed levels. Thus, the programming process needs to be terminated for some cells, while for other, it needs to be continued.

Some of the factors influencing the programming speed in floating gate cells are: variations in process parameters such as channel length, gate coupling ratio, drain coupling ratio, source resistance variations (array effect) and channel doping variations. Another factor influencing the program rate is the temperature of the product during programming; generally, the lower the temperature, the faster the programming rate.

In NROM cells, the parameters that affect the programming speed are: the ONO thickness, the channel length, the channel doping and the temperature. For dual bit NROM cells, the programming state of one bit affects the programming speed of the other bit.

When an improper programming algorithm is used, some cells may receive too high programming voltages or may be programmed for too long. In such instances, an overabundance of charge is introduced into the gate or retention layer (NROM) and the memory cell is "over-programmed". In floating gate cells, over-programming deteriorates the quality of the oxide layer (reference number 109, FIG. 1), creating reliability problems due to the degradation of the quality of the product. Furthermore, continuing to apply high voltage pulses once the unit cells have already reached the programmed level wastes power and creates a power dissipation problem.

Moreover, as to be described below, in multi-level floating gate products, over-programming can lead to information read failures. Reference is now made to FIG. 5, a graph illustrating the different threshold voltage levels comprised within a multi-level floating gate cell. As depicted in the FIG. 5, each bit in the multi-level floating gate cell is defined by a predefined region of voltage threshold $V_{TH}$. As an example, the first bit lies in region 132, (to the left of line W), while the second bit lies in region 134 (from line W to line X), the third bit in region 136 (from line X to line Y), and so on. When a cell is over-programmed, the resultant threshold voltage may overshoot the desired region, thus leading to a read error or failure.

Further problems arise when programming both bits of multi-bit memory cells, such as the two-bit NROM cell. Once the first bit is programmed, the threshold voltage $V_{TH}$ of the cell is raised, and consequently, the programming of the second bit of the cell is slower.

In NROM cells, in addition to the stated problems connected with breakdown of the oxide layer and unnecessary dissipation of power, over-programming creates different problems. As explained below in connection with FIG. 6, over-programming results in quality deterioration and reliability degradation, as well as read failures in two-bit cells.

FIGS. 6A, 6B, 6C and 6D, to which reference is now made, are exploded views of the NROM cell depicted in FIGS. 2A and 2B. It is noted that the shape of the trapped charge in chargeable areas 106 and 108 range from a narrow pocket, depicted as 106N and 108N, to an average pocket (i.e. 106A and 108A), to an even wider pocket (i.e. 106W and 108W) with a "tail" 44.

Applicants note that tail 44, which is further from the bit line than the bulk of the trapped charge, is generally not removable during erasure and thus, reduces the ability of the NROM cell to withstand a large number of program and erase cycles. Typically, erasure depletes only the charge concentration closest to the diffusion area. Thus, if the distribution pocket is too wide, the tail 44 of the trapped charge will not erase, and with each progressive erase, more and more charge will remain in the retention section, even after erasures (FIG. 6D).

The trapped charge in tail 44 acts as partially programmed charge. It is due to the trapped charge in tail 44 that fewer programming pulses are required to achieve the programmed threshold voltage level (since the bit is already, in effect, partially programmed).

Furthermore, the accumulation of trapped negative charge far from the junction increases the threshold voltage level, which affects the reverse read, making it difficult to distinguish the first bit from the second bit and creating read failures. In order to compensate, the erase operation accumulates extra positive charge close to the junction, which makes the erase time take longer.

Unfortunately, prior art methods of gradually increasing the programming gate voltage $V_G$ are not effective for NROM cells, and tend to produce the following two problems:

1. In NROM products, increases in the gate voltage $V_G$ do not linearly correlate to increases in the threshold voltage $V_{TH}$, and the effect of the increases varies from cell to cell. This causes a lack of precise programming control, and an incurred risk of over programming.
2. In order to ensure a reasonable yield rate, meeting the programming rate requirement, the drain voltage $V_D$ potential must be high, creating trapped charge regions distant from the junction.

The above two problems result in reduction in the endurance of the product, increase in the charge loss and reduction in yield.

In regard to the first problem, reference is now made to FIG. 7, an electrical schematic of a portion of an NROM array. The depicted circuit includes a bit line power supply $V_{PPS}$, a select transistor 152, resistors R1 and R2, and an NROM cell 154. Resistors R1 and R2 denote the native resistance of the wire in the depicted array. Transistor 152 is a select transistor used to select a bit line of the array. Programming current $I_{PR}$ flows throughout the entire circuit. The voltage drops across the channels of transistor 152 and cell 154 are designated as $V_{DS-SEL}$ and $V_{DS}$ respectively.

In NROM cells, small increases in the programming gate voltage $V_G$ greatly influences the programming current $I_{PR}$. In a chain reaction effect, when the programming gate voltage $V_G$ is stepped, programming current $I_{PR}$ increases, which causes an increase in voltage drops $V_{DS-SEL}$ and $V_{DS}$ and an increase in the voltage drops along resistors R1 and R2. Hence, with all the different factors changing, there is no clear linear relationship between the stepped gate voltage $V_G$ and the threshold voltage $V_{TH}$, and therefore, no precise control over the programming process. As a further complication, the reduction in $V_{DS}$ increases the programming time exponentially.

Reduction in the incremental increase of the gate voltage $V_G$ can alleviate part of the control problem, but it will dramatically increase the programming time. Further control improvement can be achieved by increasing the dynamic range of the gate voltage $V_G$. Unfortunately, there are resultant difficulties at both ends of the dynamic range.

Low gate voltage $V_G$ results in cycling degradation. So therefore, the desired gate voltage $V_G$ is set relatively high, i.e. 8–10V. Further increases in gate voltage $V_G$, such as over 10V, require special processes and put severe limitations on the scaling of the ONO thickness due to charging by tunneling. For example, a 180 Å ONO of the 0.5 $\mu$m process will experience tunneling charging for voltages over 12V.

The second problem noted above (high drain voltage $V_D$) creates even more severe limitations on the stepped gate voltage $V_G$ approach. When programming according to stepping of the gate voltage $V_G$, the programming drain voltage $V_D$ must be fixed and high in order to cover a large dynamic range. Using a high programming drain voltage $V_D$ creates a large lateral field and a wide pinch-off regime, yielding a wide trapped charge region. Accordingly, the resultant product is the undesirable tail 44, which drastically reduces the product's endurance.

Hence, due to the first problem noted above, using the gate voltage $V_G$ as a dynamic parameter for controlling programming is very limited in range.

In conclusion, in NROM cells, stepping the programming gate voltage $V_G$ does not provide tight programming control and is not effective in preventing over-programming and eventual degradation of the product's quality.

As can be understood from the above, when prior art programming algorithms are applied to the NROM cell, they do not sufficiently provide the abilities to produce increased programming speed while maintaining tight programming control. Applicants have found a need for an NROM programming algorithm which executes these functions over a wide range of programming parameters, thus avoiding the dangers of over-programming and its resultant reduction in product reliability.

SUMMARY OF THE INVENTION

An object of the present invention is to provide improved programming and erasure methods.

A method for programming and erasing a memory array includes the step of adapting programming or erase pulses to the current state of the memory array. In one programming embodiment, the step of adapting includes the steps of determining the voltage level of the programming pulse used to program a fast bit of the memory array and setting an initial programming pulse level of the memory array to a level in the general vicinity of the programming pulse level of the fast bit.

Additionally, in accordance with a preferred embodiment of the present invention and for programming, the step of determining includes the steps of programming a small set of bits of the memory array, setting a starting programming pulse level to a programming pulse level not higher than the programming pulse level used to program a fast bit of said small set, programming generally all of the bits of the memory array beginning at the starting programming pulse level, and setting the initial programming pulse level to a programming pulse level in the general vicinity of the programming pulse level of the fast bit.

Moreover, in accordance with a preferred embodiment of the present invention, generally all of the bits is everything but the bits of the small set. Alternatively, they can include all of the bits of the array.

In another embodiment of the array, the step of adapting for programming includes the steps of measuring the current threshold level of a bit to within a predetermined range and selecting an incremental voltage level of a next programming pulse for the bit in accordance with the measured current threshold level.

Moreover, in accordance with a preferred embodiment of the present invention, the step of measuring includes the step of having multiple verify levels for the array.

Furthermore, in accordance with a preferred embodiment of the present invention, the magnitude of the incremental voltage level corresponds to the measured current threshold level such that, after programming with the incremental voltage level, the bit generally is fully programmed or slightly less than fully programmed. For the latter, the present invention includes the step of final programming the bit with a small incremental voltage level after the step of programming with the incremental voltage level.

Moreover, in accordance with a preferred embodiment of the present invention, the step of adapting for erasure includes the steps of determining erase conditions of the erase pulse used to erase a representative portion of the memory array and setting initial erase conditions of the memory array to the general vicinity of the erase conditions of the representative portion.

In another embodiment, the step of adapting for erasure includes the steps of measuring the current threshold level of a bit to within a predetermined range and selecting an incremental voltage level of a next erase pulse for the bit in accordance with the measured current threshold level.

Moreover, in accordance with a preferred embodiment of the present invention, the step of measuring includes the step of having multiple verify levels for the array.

Finally, in accordance with a preferred embodiment of the present invention, the erase conditions comprises at least one of the following set: the gate voltage level, the drain voltage level, the erase duration and any combination thereof.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention teaches an NROM cell algorithm which regulates the bit line voltage $V_{BL}$ provided to the bit line acting as the drain, thereby providing tight programming control. Furthermore, the described invention provides the combination of a fast programming algorithm with reduced over-programming risk, and hence improved product endurance and cycling ability.

Although a bit line can act as either a source or a drain, in the present application, references to the bit line voltage $V_{BL}$ refer to the voltage produced to the situations when the bit line currently acting as a drain. For purposes of clarity herein, when the bit line acts as a source, it is herein referred to as a source.

The present invention further teaches the use of a low programming bit line voltage $V_{BL}$ to produce a tight spatial distribution of trapped charge, thereby resulting in better two-bit separation in the NROM cell, faster erase, and increased product life.

Figure 8A:
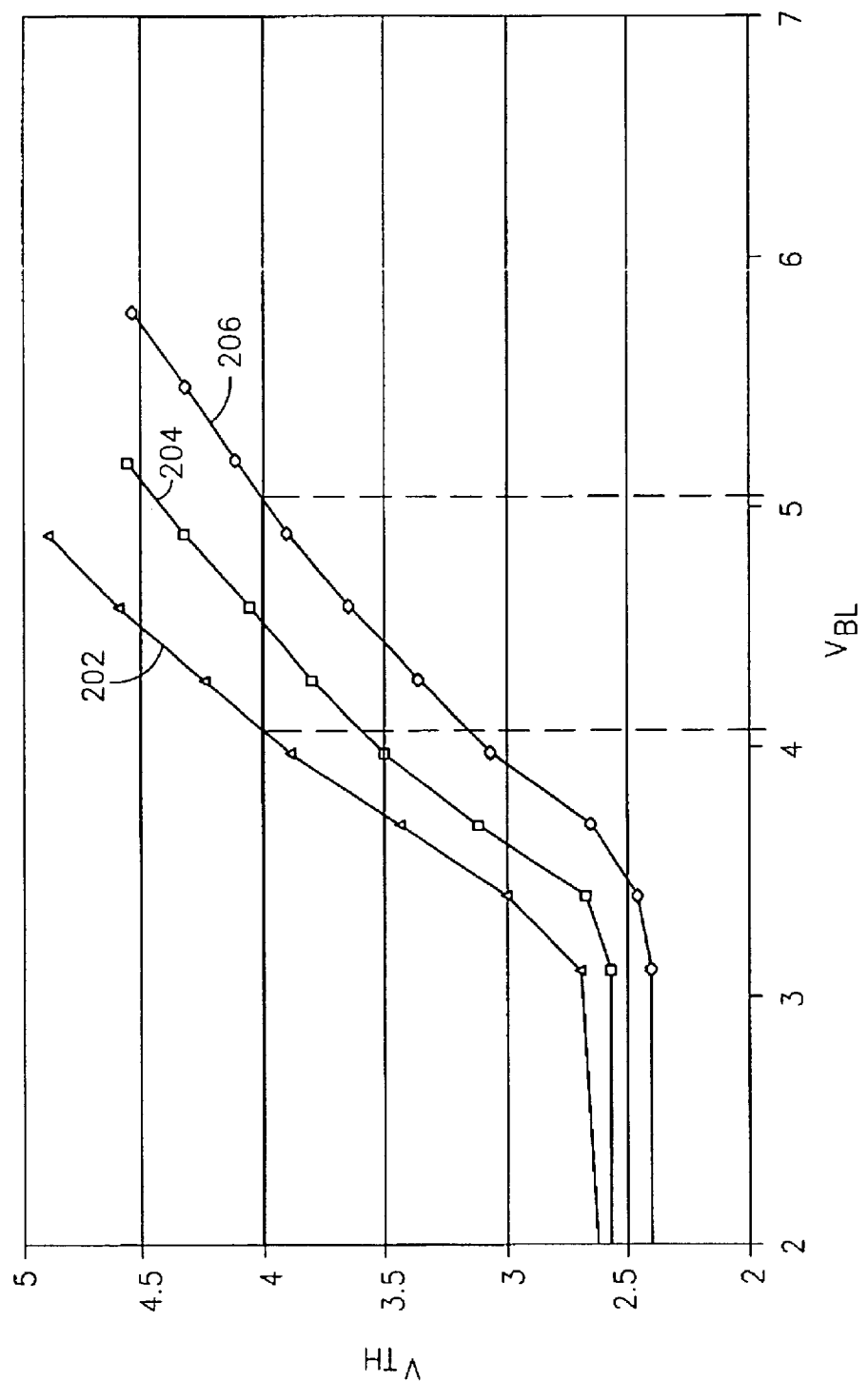
FIGS. 8A, 8B and 8C are graphs illustrating the effect of programming drain voltages on the threshold voltage, as a function of cell temperature, channel length, and array and second bit effects, respectively.
Figure 8B:
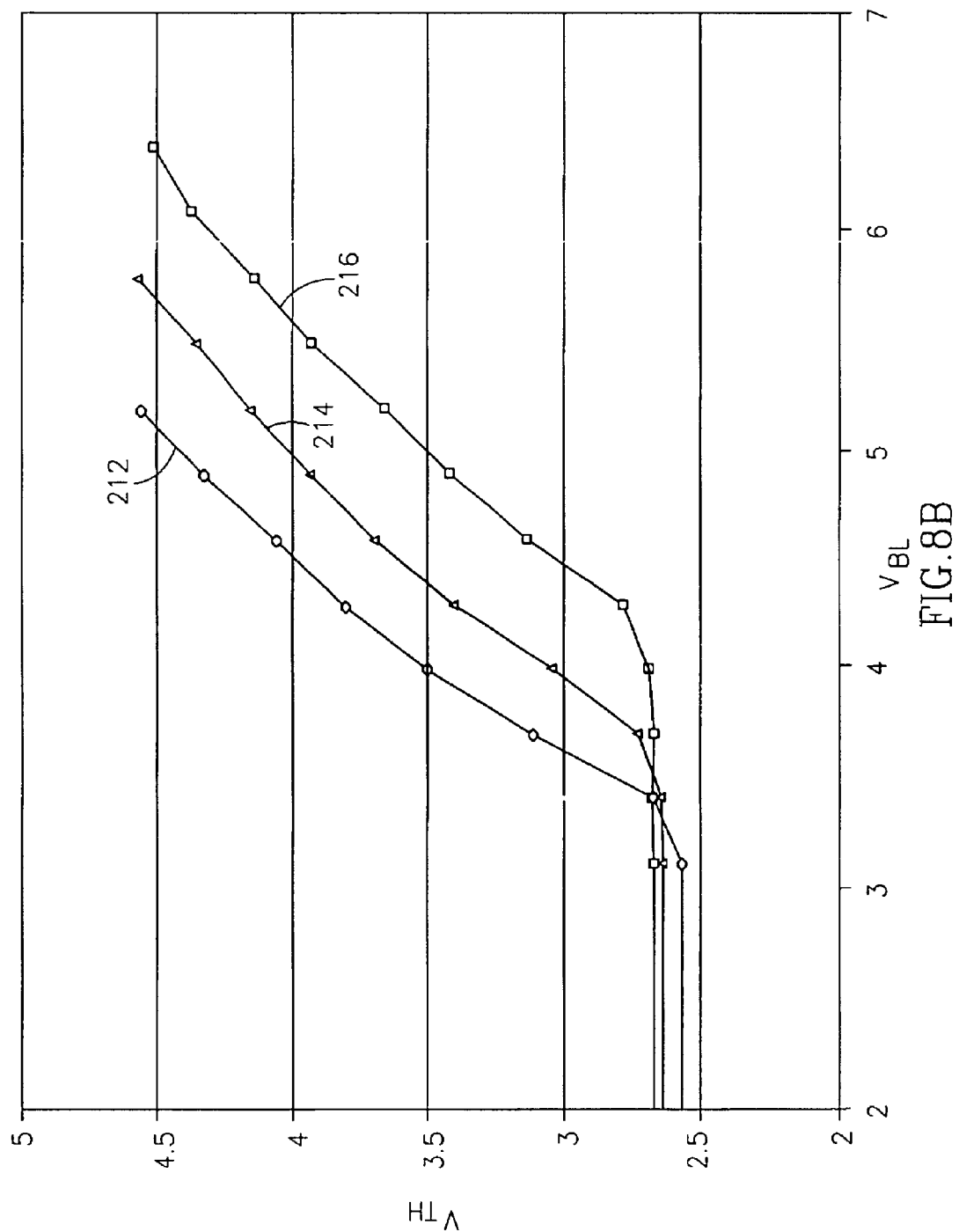
Figure 8C:
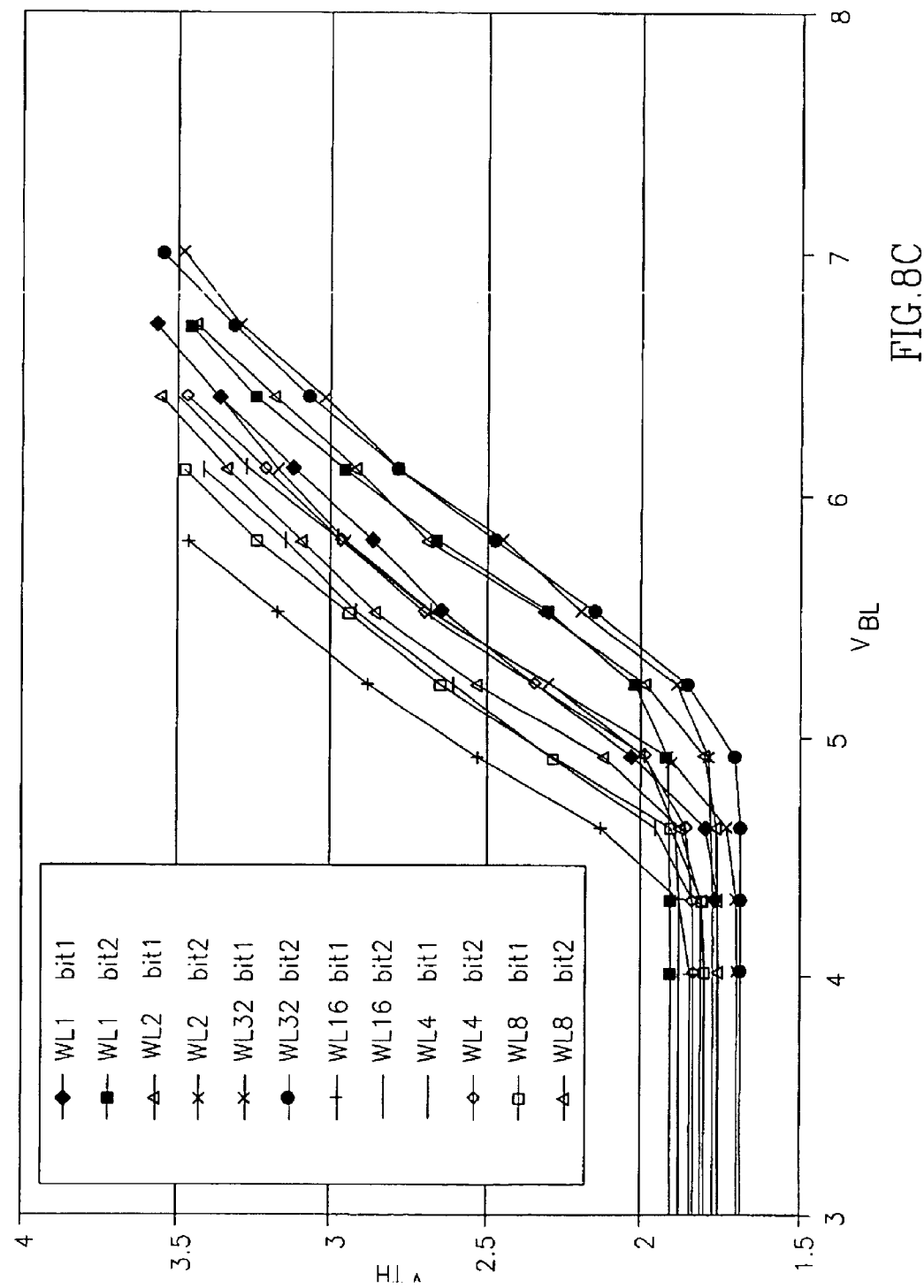

Furthermore, by controlling the bit line voltage $V_{BL}$, the present invention provides a fast and generally accurate programming algorithm for a large distribution of cells with diverse process variations and programming times. Reference is now made to FIGS. 8A–C, a series of graphs that illustrate the effect of the programming bit line voltage $V_{BL}$ on threshold voltage $V_{TH}$ as a function of cell temperature, channel length, and array effects/second bit, respectively. In this graph the reverse read threshold voltage $V_{TR}$, which is the threshold voltage $V_{TH}$ when the cell is reverse read, is a function of bit line voltage $V_{BL}$. Every point represents a programming pulse of 2 μsec in exemplary steps of 0.3V. It is noted that the gate voltage $V_G$ is constant at 9V.

The graph in FIG. 8A illustrates 3 programming curves for three varying cell temperatures: curve 202 denotes a cell at −40° C., curve 204—a cell at 20° C., and curve 206—a cell at 80° C. As seen in the figure, in order to achieve a specific threshold voltage $V_{TH}$, each cell receives a different drain voltage $V_D$, depending on the temperature of that specific cell. As an example, to achieve a desired threshold voltage $V_{TH}$ of approximately 4V, the low temperature case (curve 202) receives a bit line voltage $V_{BL}$ of approximately 4.1V, while the high temperature case (curve 206) must receive a bit line voltage $V_{BL}$ potential of 5V to reach the same desired threshold voltage $V_{TH}$ level. Accordingly, in a preferred embodiment, the bit line voltage $V_{BL}$ is incrementally increased from a minimum voltage to a higher voltage, thus covering a wide range of operating temperatures.

When a cell has reached the desired threshold voltage $V_{TH}$, such as 4V, the programming algorithm for that cell is terminated. Meanwhile, for cells which have not yet reached the desired threshold voltage, the bit line voltage $V_{BL}$ is incrementally increased, until those cells have reached their desired level. Thus, referring to the example above, when operating at a low temperature (curve 202), the cell will complete programming at a bit line voltage $V_{BL}$ of 4.3V, while if operating at high tempeartures (curve 206), the cell will complete programming at a bit line voltage $V_{BL}$ of approximately 5V. It is noted that for curves 202 and 206, the bit line voltages $V_{BL}$ of 4.3V and 5V, respectively, are the first bit line voltage levels that result in a threshold voltage $V_{TH}$ higher than the exemplary target of 4V.

It is also apparent from FIG. 8A that the chosen step size for the bit line voltage $V_{BL}$ affects the size of the maximum overshoot (over-programming) of the threshold voltage $V_{TH}$. In order to achieve a very accurate bit line voltage $V_{BL}$ rise, it is preferable that the step size is relatively small. Thus to receive the programming level, the resultant algorithm requires many programming steps and may result in extended programming times. Conversely, a large voltage step results in quicker programming times however, opens up to the risk of a large overshoot. The practical step size is a compromise between the requirements for quick programming speed and limited overshoot.

It is noted that, when observing the section of the graph commencing at a bit line voltage $V_{BL}$ of 3V, although the absolute rise of the curves may differ, the slopes of the curves are essentially equivalent, and approximately linear. Consequently, for each step in the bit line voltage $V_{BL}$, there is an equivalent step in the threshold voltage $V_{TH}$, regardless of the temperature of the cell.

Thus, for a known incremental increase in drain voltage $V_D$, it is possible to guage the incremental increase in threshold voltage $V_{TH}$. Knowing this information allows for more precise programming abilities and a greater protection against over-programming, with all the detrimental affects associated therewith.

FIG. 8B is comparable to the graph of FIG. 8A and depicts the effect of the of the bit line voltage $V_{BL}$ on the reverse read threshold voltage $V_{TH}$ as a function of a channel length of 0.6 μm, 0.65 μm and 0.7 μm respectively, for curves 212, 214, and 216, respectfully. FIG. 8C depicts the effect of the of the bit line voltage $V_{BL}$ on the reverse read threshold voltage $V_{TH}$ as a function of the location of a cell along a 32 bit long local diffusion bit-line segment and a comparison between the 1$^{st}$ and 2$^{nd}$ bit of the same cell. The fastest bit is bit 1 of word-line 16 and the slowest is bit 2 on word-lines 32 and 2. In order to reach a threshold voltage $V_{TH}$ of 3.5V, the fastest bit receives a bit line voltage $V_{BL}$ equal to approximately 5.8V, and the slowest, receives approximately 7V.

As was noted in FIG. 8A, and bringing attention to a similar phenomenon in FIGS. 8B and 8C, although the characteristics of the represented cells differ, the programming slope is generally equivalent and generally linear. Hence, the explanation as outline above for FIG. 8A is also applicable to these figures, and the conclusions drawn for FIG. 8A are also applicable to FIGS. 8B and 8C.

Consequently, for an array of cells with a wide divergence of process and/or environmental conditions, by stepping the bit line voltage $V_{Bl}$, it is possible to achieve a controlled programming algorithm with an accurate prediction of the delta threshold voltage $V_{TH}$ rise.

Figure 9:
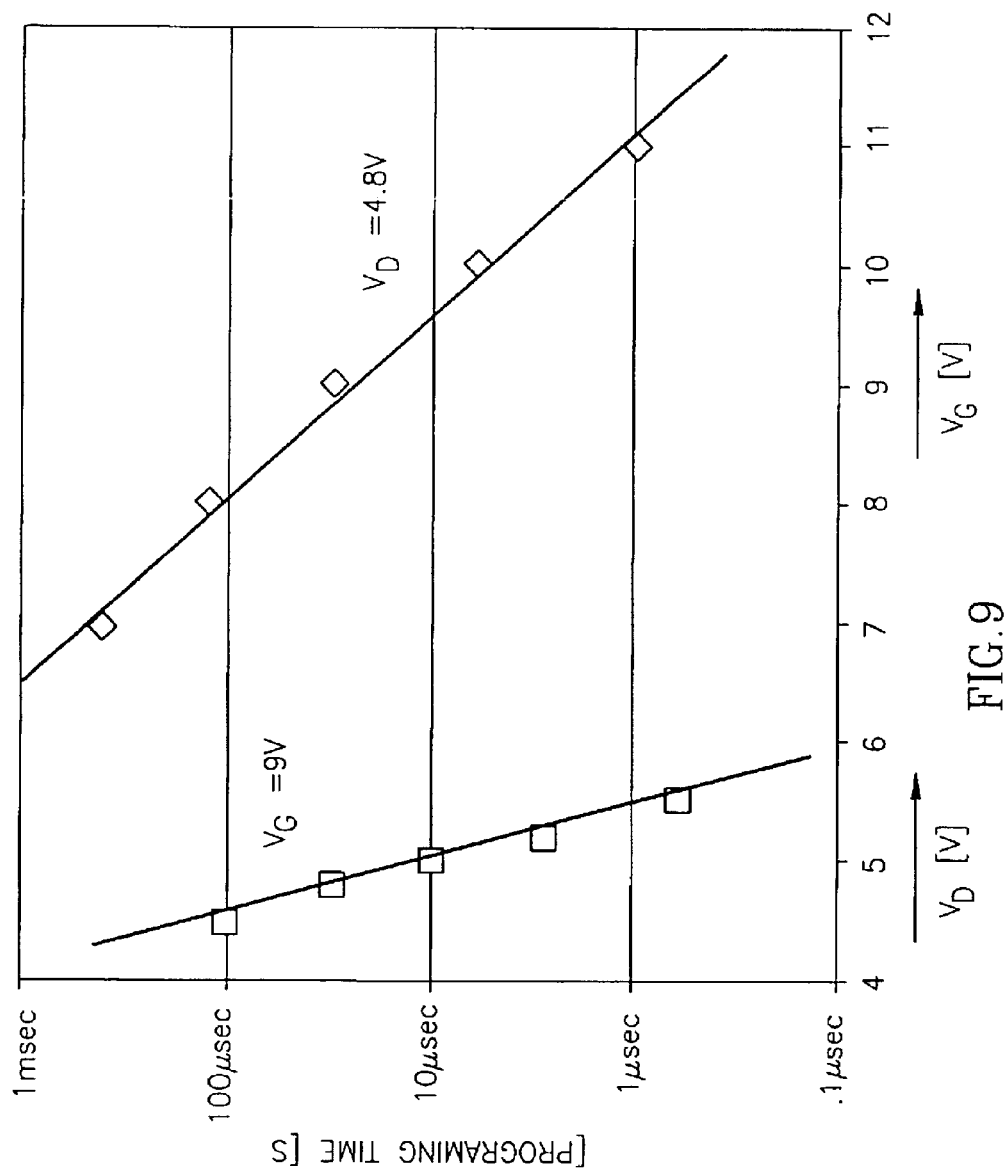
FIG. 9 is a graph illustrating the effect of the gate voltage and the drain voltage on the threshold voltage.

Although it is possible to cover a diverse range of programming variations by stepping the gate voltage $V_G$, as was done in prior art floating gate algorithms, in NROM cells, drain voltage V stepping is more efficient. Reference is now made to FIG. 9, a graph illustrating the programming time of an exemplary cell (channel length=0.65 μm, temperature=20° C.) as a function of either drain voltage $V_D$ or gate voltage $V_G$.

When programming with a constant gate voltage $V_G$ and a stepped drain voltage $V_D$ between 4.5V to 5.5V, the resultant programming times range from of 100 μsec down to 0.8 μsec, respectively. However, in order to achieve approximately the same programming time range with a constant drain voltage $V_D$, the gate voltage must be stepped from 8V to 11.5V. Thus, in the NROM cell, in order to cover an equivalent range of programming times, a 1V step in drain voltage $V_D$ is equivalent to a 3.5V step in gate voltage $V_G$.

As further noted and depicted in FIG. 9, when stepping the gate voltage $V_G$, in order to catch the fast programming cells without risking over-programming, the resultant programming algorithm must commence with a low potential for the gate voltage $V_G$. This, however, is undesirable since it causes programming to be slow. Hence, in order to increase the programming speed, the low gate voltage $V_G$ must be paired with high drain voltages $V_D$.

Nonetheless, as noted in the previous sections, high drain voltages $V_D$ promote cell degradation and decreased cycling ability. Unequivocally, high drain voltages $V_D$ in combination with a low gate voltages $V_G$ are even more detrimental to the cell, producing very large lateral fields and wide pinch-off regions, yielding an extensive trapped charge region.

In contrast, in the present invention, in order to capture the fast programmers, the inventive programming algorithm commences with a low drain voltage $V_D$, and a high gate voltage $V_G$. This is favorable since applying a high programming gate voltage $V_G$ and a low drain voltage $V_D$ imposes a large vertical field and a narrow pinch-off regime, thus resulting in a narrower trapped electron pocket.

Figure 1:
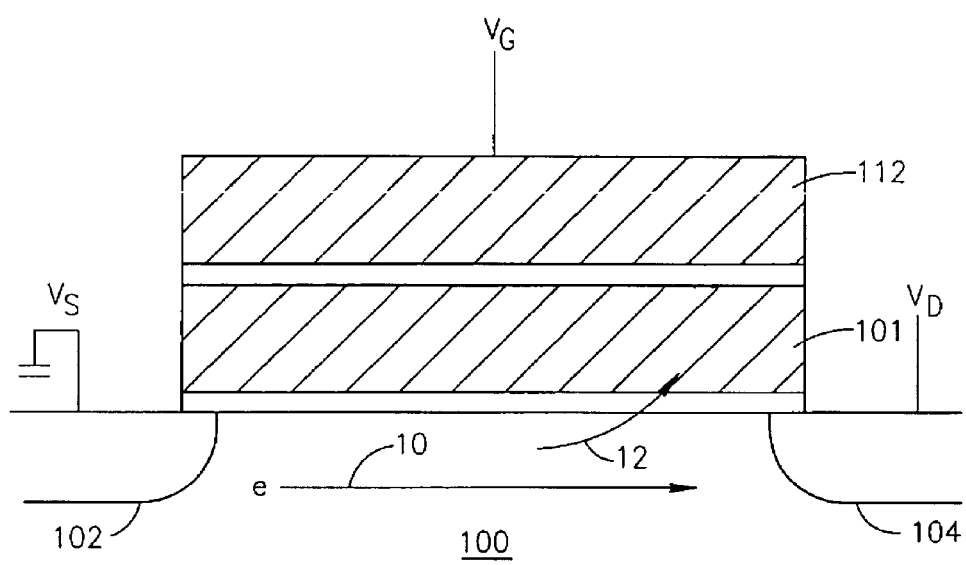
FIG. 1 is a schematic illustration of a floating gate memory cell.
Figure 2A:
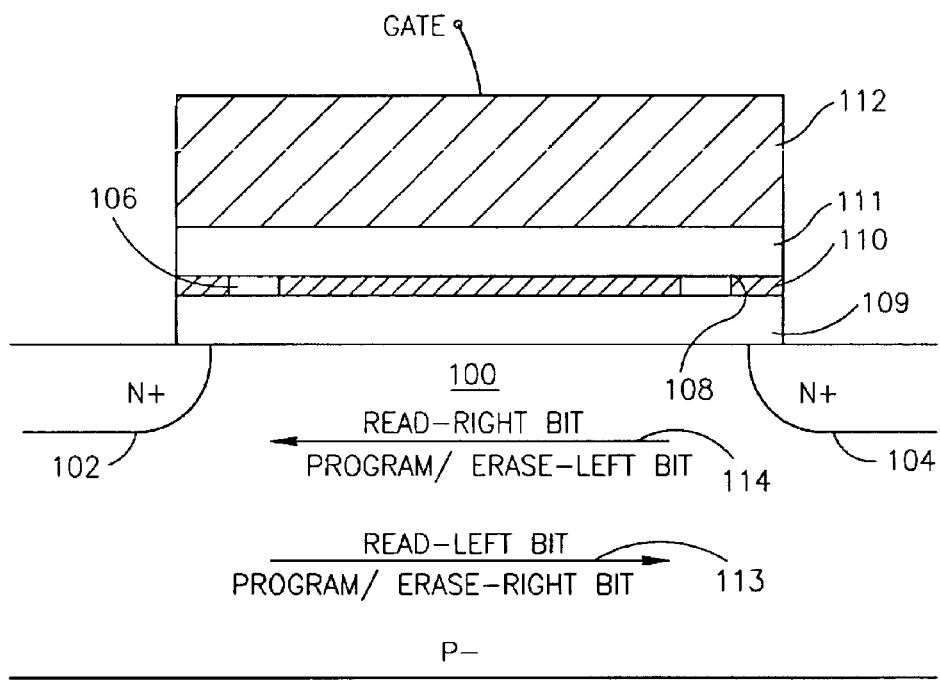
FIGS. 2A and 2B are schematic illustrations of a NROM memory cell.
Figure 2B:
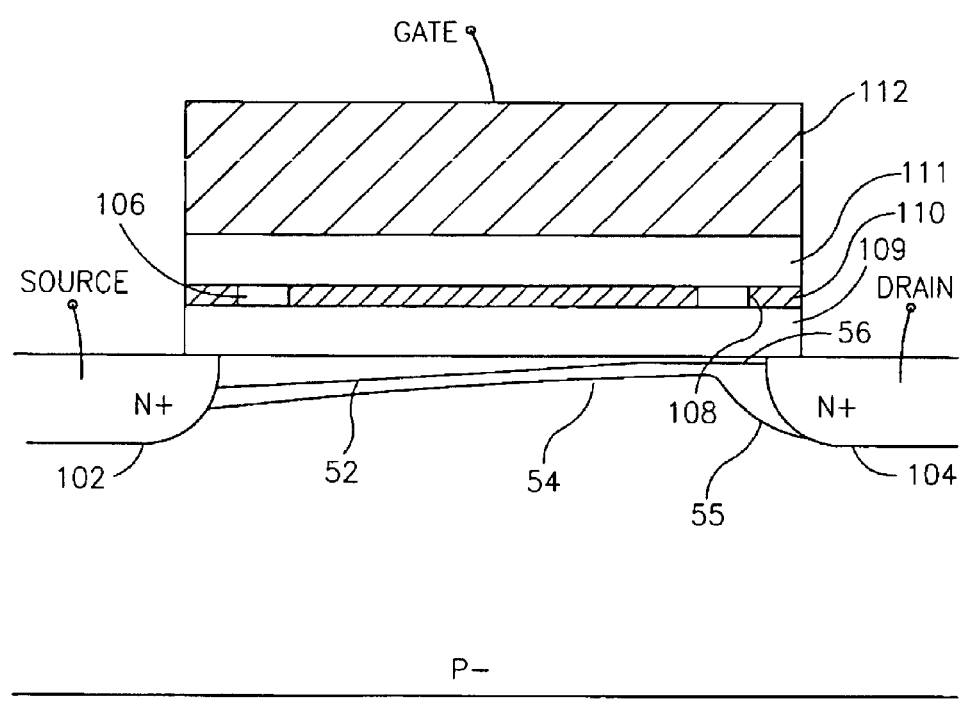
Figure 3A:
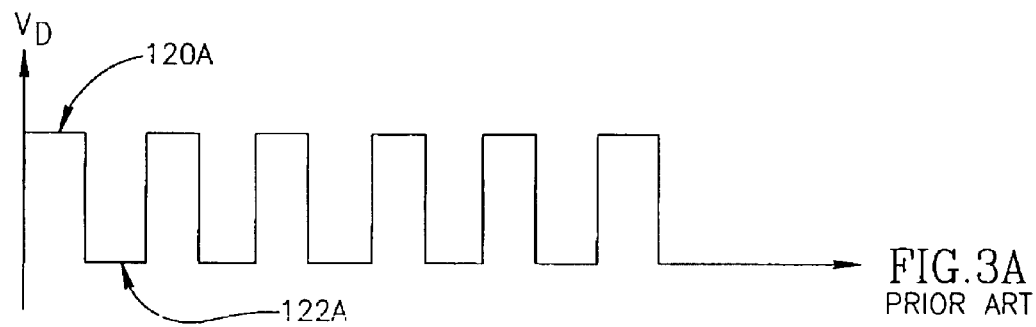
FIGS. 3A, 3B and 3C are graphical illustrations of a prior art programming scheme.
Figure 3B:
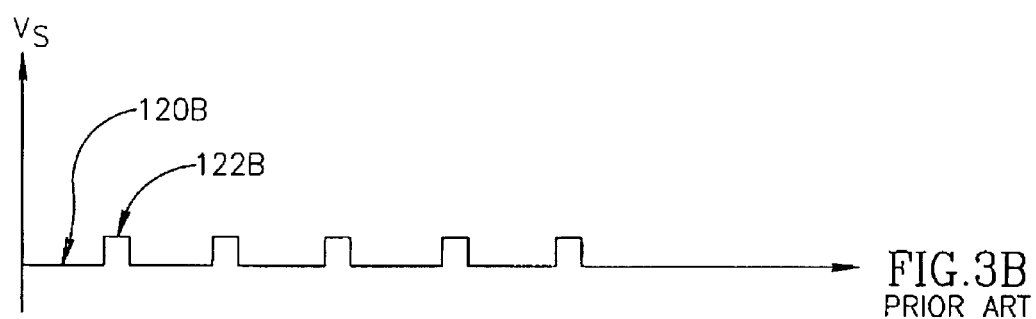
Figure 3C:
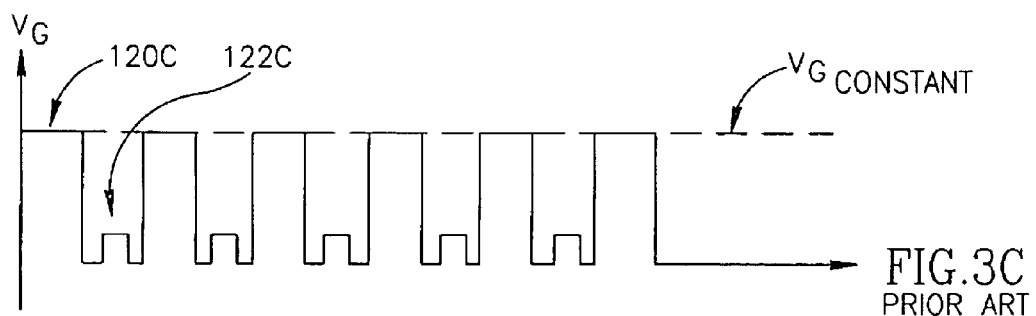
Figure 4:
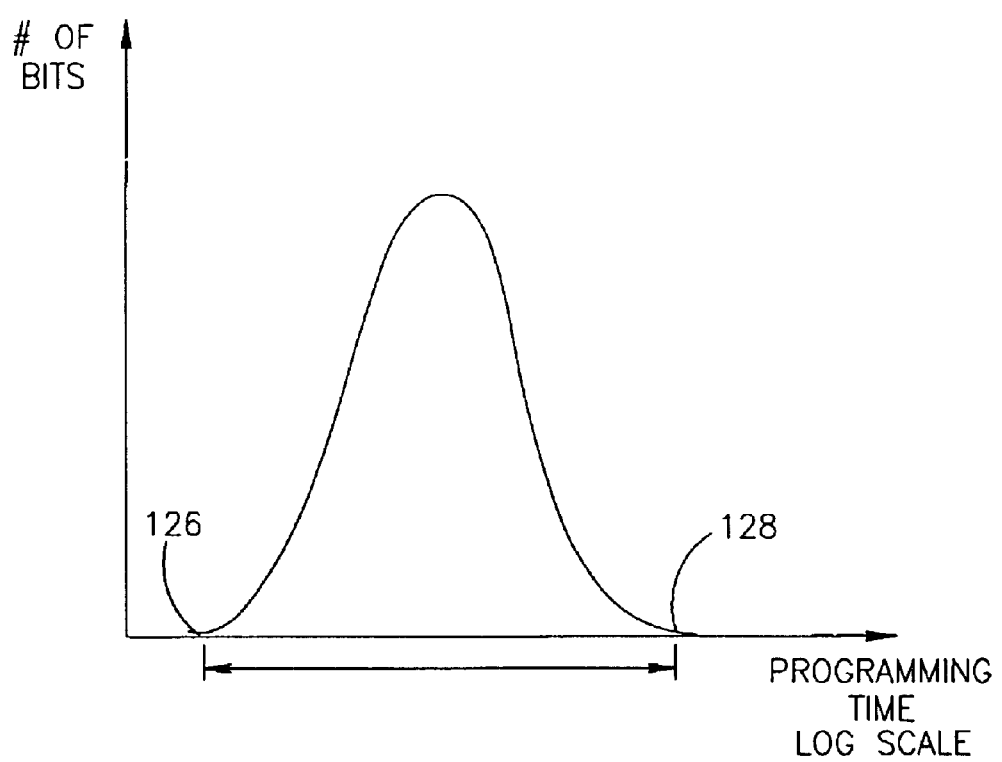
FIG. 4 is a histogram of the distribution of programming speed in NROM memory cells.
Figure 5:
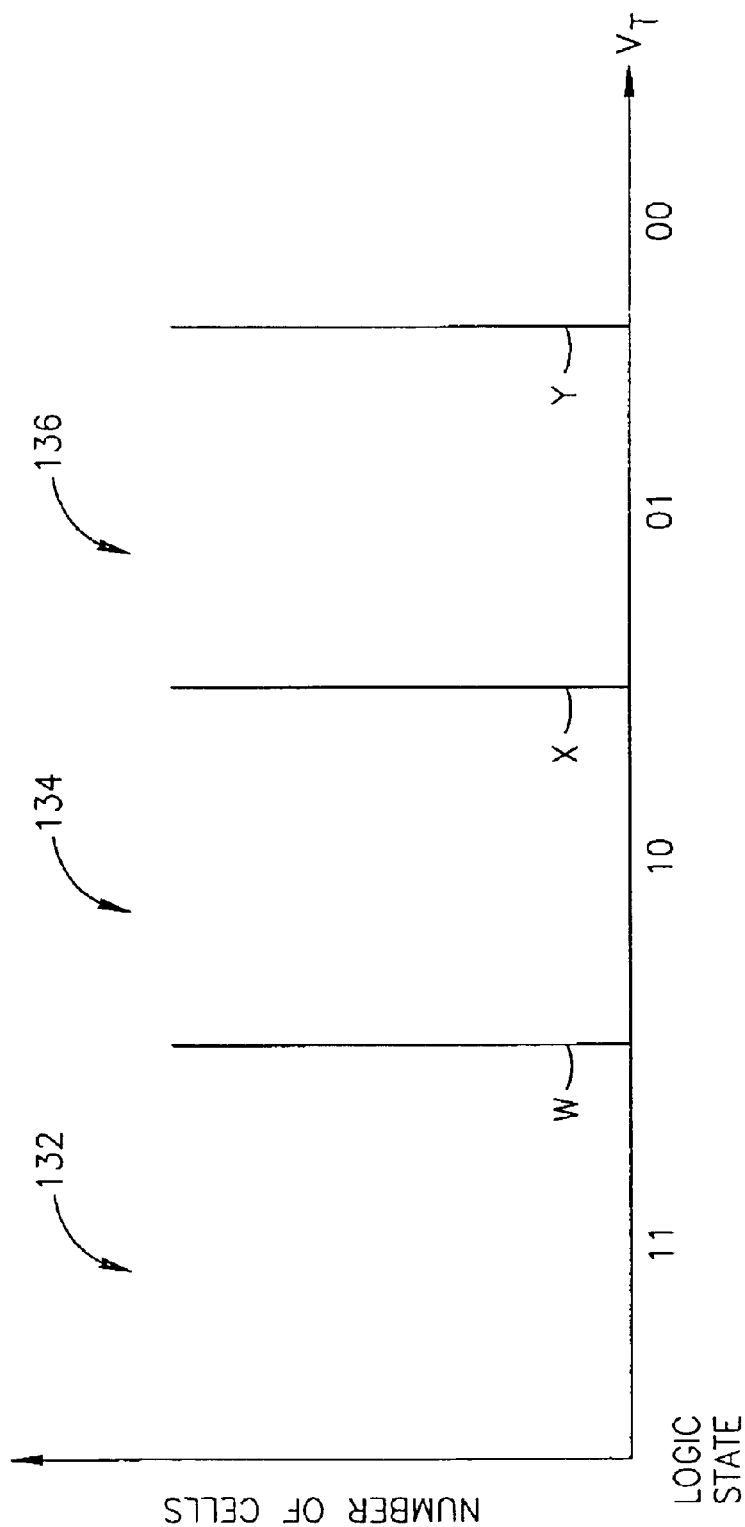
FIG. 5 is a graph of the charge levels in a multi-level floating gate cell.
Figure 6A:
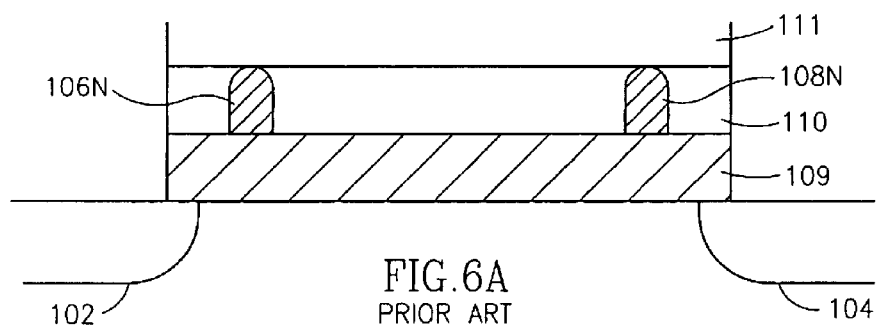
FIGS. 6A, 6B, 6C and 6D are schematic illustrations of trapped charge retained in a two-bit NROM memory cell.
Figure 6B:
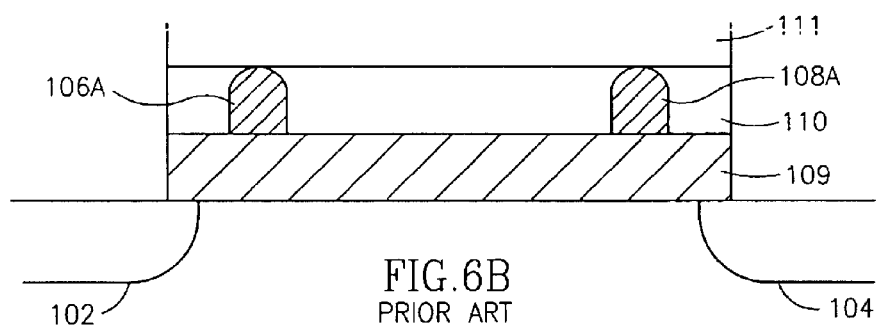
Figure 6C:
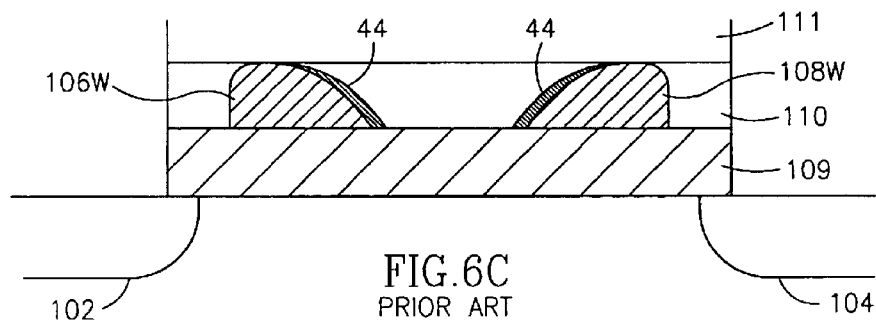
Figure 6D:
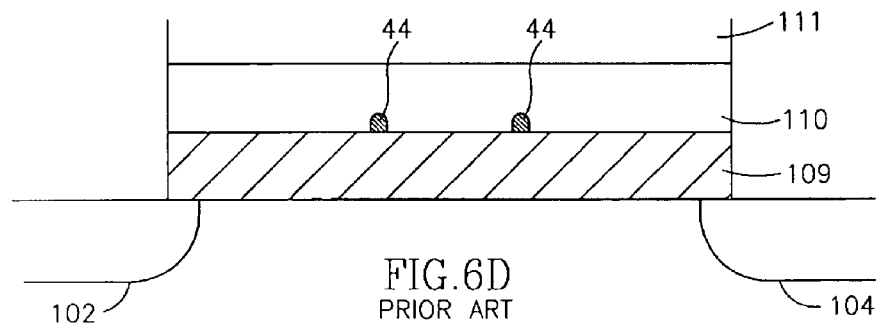

In order to explain the present invention in more detail, reference is now made again to FIGS. 2A and 7. As noted above (FIG. 2A), in NROM cells the charge is trapped in a localized region and the read process is a reverse read. As such, the programming current $I_{PR}$ is generally insensitive to the rise in threshold voltage $V_{TH}$, and remains constant even during programming.

Figure 7:
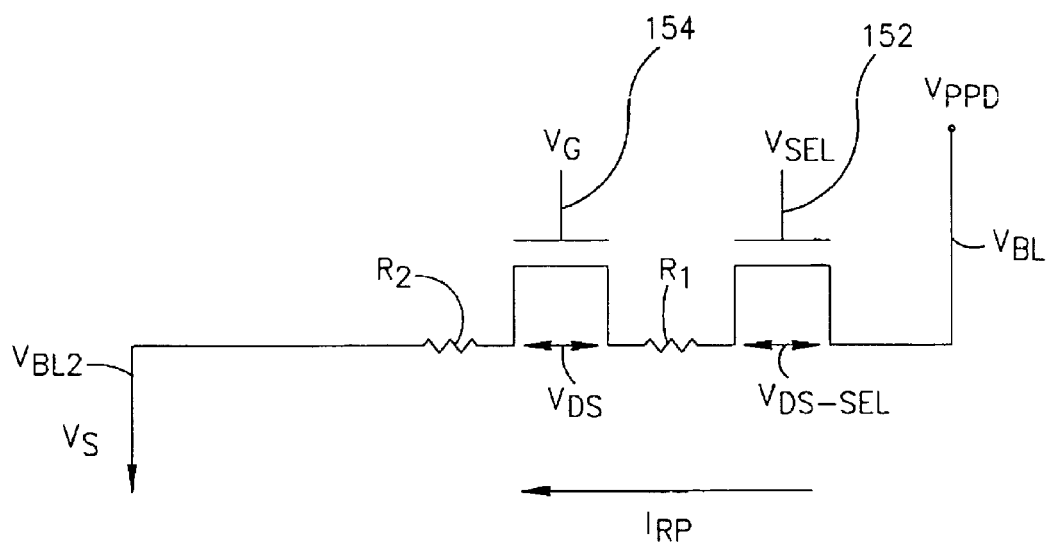
FIG. 7 is an electrical schematic illustration of a portion of an NROM array.

The programming current is fixed during programming since the cell is programmed in the forward direction, which causes the charge to be trapped next to the drain. Hence, during reading, there is full punch-through under the localized charge. Additionally, for each increase in the threshold voltage $V_{TH}$, the charge is punched through at a greater distance from the junction.

$$\text{Hence, } \Delta V_{DS} = \alpha \Delta V_{TH} = V_{BL} - V_{BL\text{-}S} \tag{1}$$

where $V_{BL\text{-}S}$ is the bit line voltage for the source and is constant, and α is a constant proportionally between 0.5 and 2, and is affected by parameters such as channel length, gate voltage $V_G$, temperature, and location of the cell in the array. Referring now to FIG. 7, the IR loss equation that defines the circuit depicted therein is:

$$V_{PS} = V_{DS} + V_{DS\text{-}SEL} + (R_1 + R_2) * I_{PR} \tag{2}$$

Since the programming current $I_{PR}$ is constant, then the IR losses across $V_{DS\text{-}SEL}$, $I_{PR}$ and R1 and R2 are also constant. Consequently, the only remaining non-constant factor is the channel voltage $V_{DS}$. Thus $$\Delta V_{PS} = \alpha \Delta V_{DS} \tag{3}$$

Thus, since $V_{BL2}$ is constant, when combining equations (1) and (3)

$$\Delta V_{PS} \cong \Delta V_{BL} = \alpha \Delta V_{TH} \tag{4}$$

or, since $V_{BL}$ is equivalent to $V_D$ $$\Delta V_D = \alpha \Delta V_{TH} \tag{5}$$

Evidence to such can also be seen when observing the linear sections of FIGS. 8A–8C, and as explained hereinabove in reference to those graphs. Consequently, when considering this linear relationship, applicants have concluded that closely controlling the drain voltage $V_D$ produces a known change in the threshold voltage $V_{TH}$, and thus the programming algorithm of the present invention provides precise control over the programming procedure, including preventing over-programming.

Figure 10:
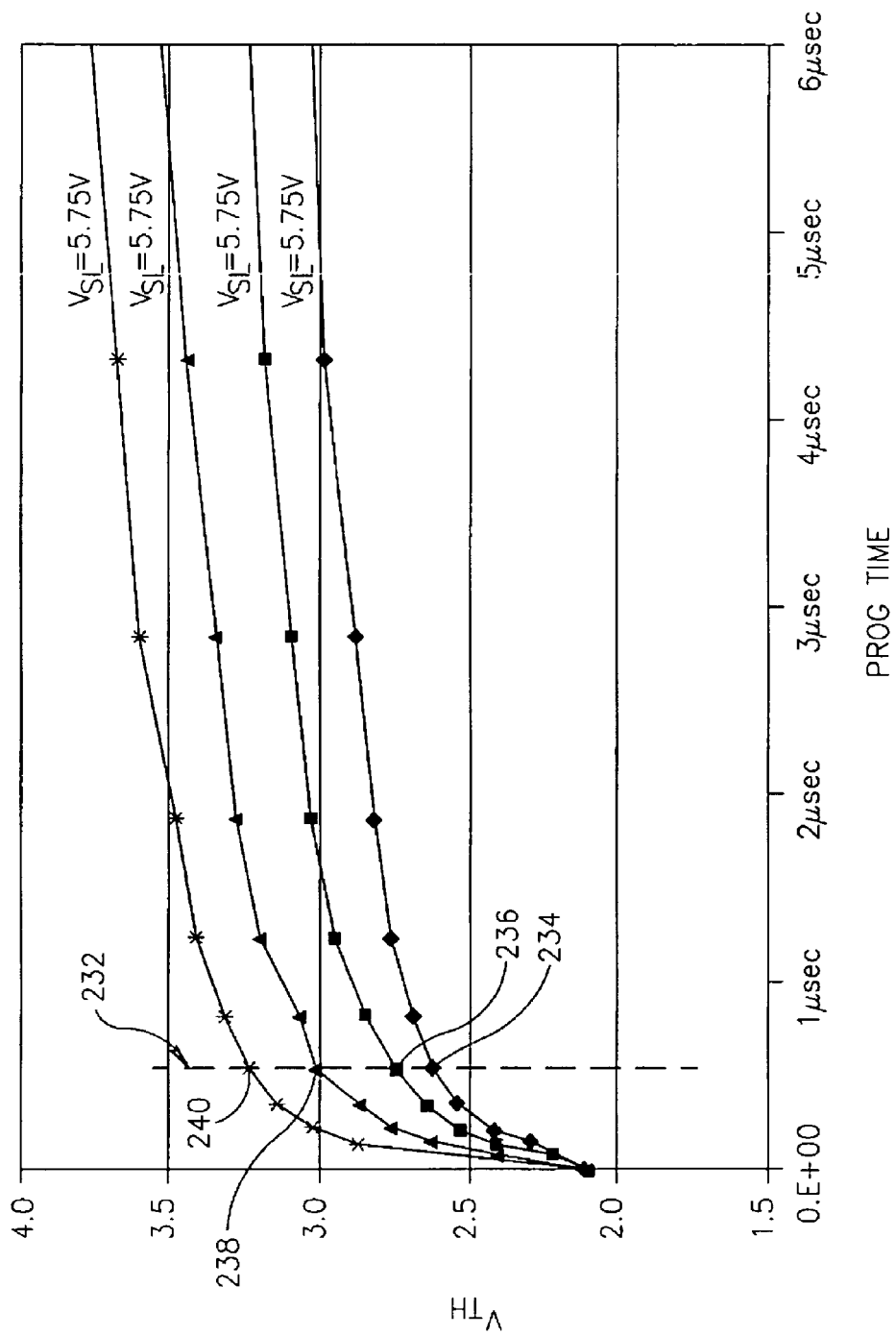
FIG. 10 is a graph illustrating the increases in the threshold voltages over time, as a function of the drain voltage.

Reference is now made to FIG. 10, a graph illustrating the rise in threshold voltage $V_{TH}$, as a function of time, with the bit line voltage $V_{BL}$ as a parameter. Depicted in FIG. 10 the resulting threshold voltage $V_{TH}$ for 4 exemplary drain voltages of 5V, 5.25V, 5.5V and 5.75 V, respectively.

As can be observed in all of the curves, the threshold voltage $V_{TH}$ rises quickly at the start of the curve, and then reaches a point where the increase in threshold voltage $V_{TH}$ i is saturated. The flatter region of the curve, to the right of dashed line 232, illustrates the region wherein the cell programming has saturated and subsequent programming pulses have a limited affect on the cell. Once saturated, most of the rise in threshold voltage $V_{TH}$ is due to an undesirable injection of remote electrons from non-primary mechanisms.

Therefore, in order to maintain an efficient increase in the threshold voltage $V_{TH}$, and in order to create a pocket of trapped charge close to the drain, it is preferable to remain in the part of the graph (to the left of line 232) where the threshold voltage rise is steep. With stepping of bit line voltage $V_{BL}$ it is possible to remain in the steep slope area (left of line 232).

As an example, when stepping in increments from the designated points 234 to 236, to 238, and to 240, it is possible to achieve equivalent increases in the threshold voltage $V_{TH}$. When observing FIG. 10, it is possible to note that in the range of points 234 240, for each 0.25V increase in the bit line voltage $V_{BL}$, there is a 0.15V increase in the threshold voltage $V_{TH}$.

It is therefore noted that, according to a preferred embodiment of the present invention, a progressively increasing drain voltage $V_D$ causes the threshold voltage $V_{TH}$ to climb along the steep slope of the programming function, and produces a more efficient and quicker programming algorithm.

Figure 11A:
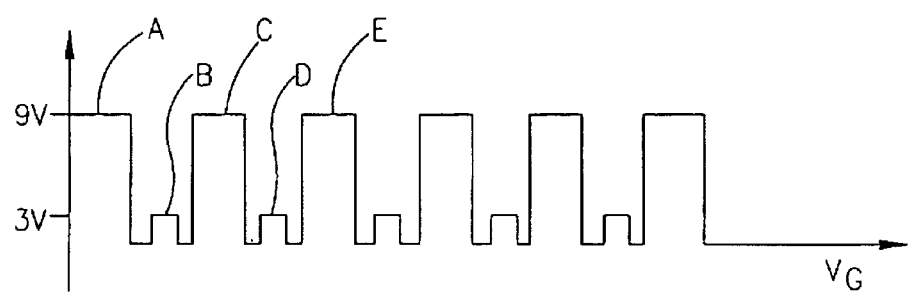
FIGS. 11A, 11B and 11C are graphical illustrations of a programming algorithm, constructed and operated according to a preferred embodiment of the present invention.
Figure 11B:
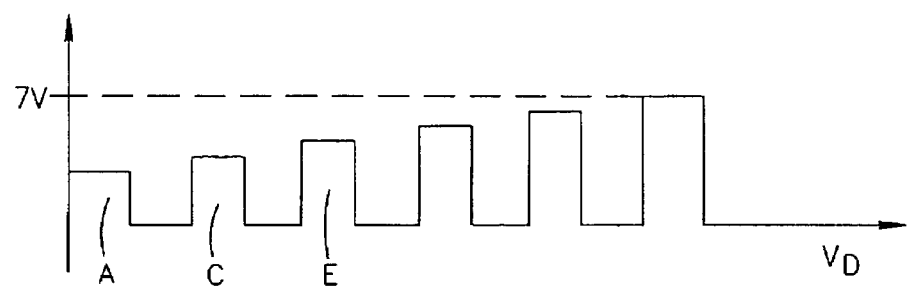
Figure 11C:
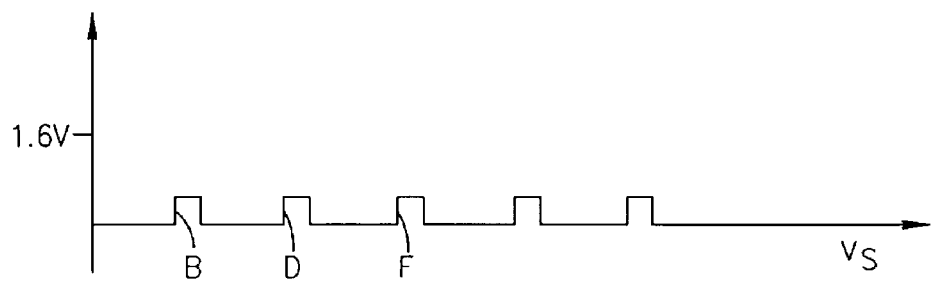

Reference is now made to FIGS. 11A, 11B, and 11C, a series of timing diagrams of a programming algorithm for NROM cells, constructed and operated in accordance with a preferred embodiment of the present invention. Although FIGS. 11A–11C illustrate only a limited number of pulses, it is apparent that a typical programming algorithm comprises numerous pulses and still complies with the principles of the present invention.

FIGS. 11A–11C depict a programming algorithm utilizing gate voltage $V_G$, drain voltage $V_D$, and source voltage $V_S$, respectively. The algorithm additionally comprises a series of alternating programming and program verify pulses. The first pulse is a programming pulse and is designated as A. The second pulse is a program verify pulse and is designated as B, and so on.

The sequence of programming and program verify pulses A, B, C, etc. are repeatedly applied to an array of NROM cells. Once the threshold voltage $V_{TH}$ of an applicable cell has reached a desired level, the programming algorithm is terminated for that specific cell. The programming algorithm proceeds until each cell has reached the desired level, at which point the algorithm is terminated. Preferably the algorithm is applied on a bit by bit basis for either a byte, or word.

With each progressive programming pulse, from A to C to E, the level of the drain voltage $V_D$ increases. Typically, the voltage steps are evenly incremented from progressive drain voltage $V_D$ pulse to pulse, i.e. at fixed increments of 0.25V, or any other desired increment.

Alternatively, in order to customize the algorithm for diverse programming times, and as a means to improve programming speed, the present method teaches unevenly incremented voltage steps, i.e. with smaller incremented steps at the start of the algorithm and larger steps as the algorithm progresses. In this manner, the the incremented steps directed to the "fast" programmers are smaller than the incremented steps for the "slow" programmers.

The explanation for such is as follows: When a cell commences programming, its threshold voltage $V_{TH}$ is relatively low. With the application of each progressive programming pulse, the threshold voltage $V_{TH}$ of the cell increases. Each time the threshold voltage $V_{TH}$ increases, a higher programming pulse is needed to force punch-through of electrons. Hence, at the start of the programming algorithm, when the threshold voltage $V_{TH}$ is low, smaller incremental jumps are sufficient to induce punch-through. However, farther into the algorithm, when the threshold voltage $V_{TH}$ is higher, larger steps are needed to produce the punch-through effect. Consequently, by varying the incremental size of the voltage step increases, i.e. with small steps at the beginning when the threshold barrier is still low, and with larger steps when the barrier is higher, it is possible to provide more precise control over the programming algorithm. See for example FIG. 8A, wherein the slope is shallower for the hot temperature cells than for the cooler temperature cells.

According to a preferred embodiment of the present invention, when programming an NROM cell, the gate voltage $V_G$ is high and constant, (e.g. 10V) and the drain voltage $V_D$ is as low as possible, resulting in a narrow spatial distribution of trapped charge. Preferably, the initial bit line voltage $V_D$ is approximately 4V.

When programming with a low initial bit line voltage $V_D$, the resultant spatial distribution of the trapped charge 24 is closer to the diffusion area, which also facilitates effective erasure and increased life cycles. It is additionally noted that, due to the tighter spatial distribution of trapped charge, the present invention produces better two-bit separation and enables better distinction between the two bits during read. Furthermore, a smaller tail of trapped charge results in less erase time and voltage. This in turn, improves retention since less erase stress creates less trapped holes in the nitride. Less trapped holes, improves the retention since there is less trapped movement at the high temperature back.

It is noted that the final step of the drain voltage $V_D$ stops at a level that is just sufficient to reach the desired threshold voltage $V_{TH}$, thus avoiding any unnecessary extra pulses of the drain voltage $V_D$ which might create secondary electron injections far from the junction, imposing the unwanted tail 44.

Frequently, due to architecture density, the applied source voltage $V_S$ is not necessarily ground or 0V. However, in order to provide a tight distribution of charge, it is preferable that source voltage $V_S$ be as close to 0V as possible, and preferably less than 0.5V.

The present invention includes adapting the programming and erasure methods of an array to its particular circumstances. For example, the speed of programming and erasure of a bit is a function of how it is manufactured, the current operating temperature, the power supply, the peripheral circuitry and, if there are two bits in the memory cell, the programmed state of the other bit. Having a programming and/or erasure method that is adaptable enables the memory array to be programmed and/or erased quickly in most circumstances, no matter how the operating and environmental conditions vary.

The present invention presents two types of adaptations, one of the initial programming or erasure level and the other of the program or erasure step.

In some instances, it may be known that all of the cells are "slow" to program. Usually, this means that the initial program steps are not effective. In accordance with a preferred embodiment of the present invention, it is possible to dial-in a higher initial drain voltage $V_D$ (pulse A). As an example, and referring again to FIG. 8B, for cells with a longer than average channel length dimension (curve 216), the initial dialed-in drain voltage $V_D$ might be 4V, while for the cells with shorter channel lengths (curve 212), the dial in drain voltage $V_D$ would be 3.1V. In such a manner, for the cells on curve 216, the first few ineffective pulses between 3.1V and 4V are eliminated, and the programming time is shortened.

The dial-in level is determined from the response of the bits of the array, as described hereinbelow, and thus, is adapted to the particular array.

Figure 12:
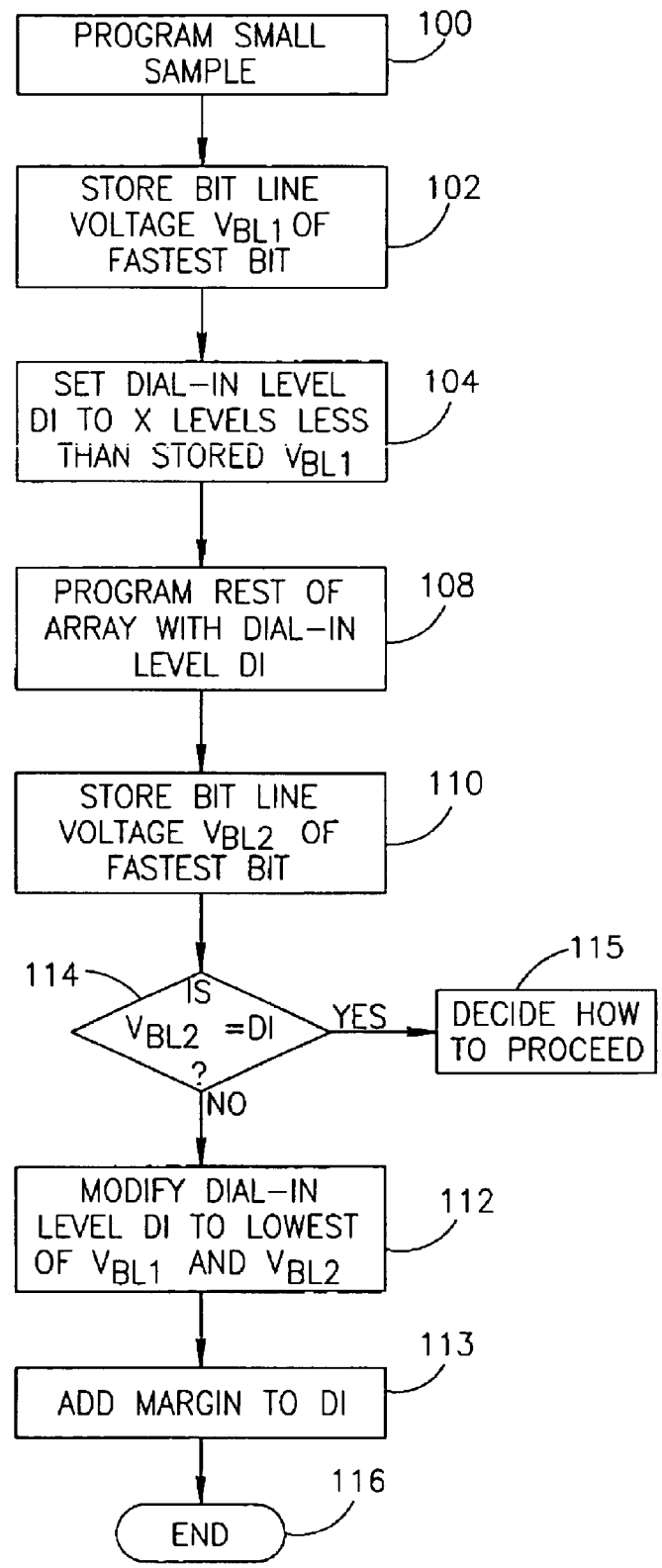
FIG. 12 is a flow chart illustration of a method of setting an initial programming voltage level, operative in accordance with a preferred embodiment of the present invention.
Figure 13A:
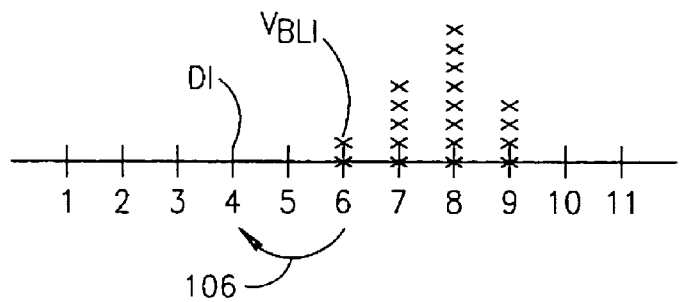
FIGS. 13A, 13B, 13C, 13D and 13E are schematic illustrations of histograms of the number of programming pulses required to program the bits of an array for the method of FIG. 12.
Figure 13B:
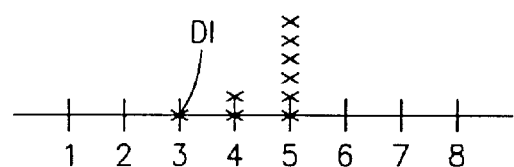
Figure 13C:
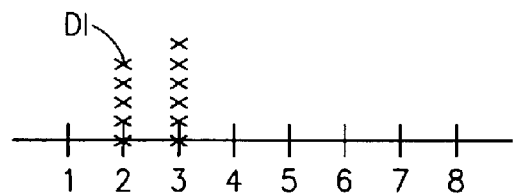

Reference is now made to FIG. 12, which illustrates the method, using the dial-in procedure, to determine the highest possible, initial programming level for the memory array. This method is generally performed once per array, as part of a sort or a test part of the manufacturing process, although it can be performed at other times as well. Reference is also made to FIGS. 13A, 13B and 13C, which are useful in understanding the method of FIG. 12.

A representative portion of the array is first programmed (step 100), where "programmed" means that the threshold voltage of each cell is above a predetermined "program verify" level.

The representative portion should include enough bits to cover the expected variation in programming responses. For example, the portion can include a few bytes. If there are more than one bit per cell, the portion should include a selection of each type of bit. The portion should also include cells in different locations within a block and/or column of cells, since the paths to such, from the power supplies, are different and each path has a different resistance level. The cells of the representative portion may be chosen according to known array effects and to sensitive manufacturing areas in the array. Which cells are chosen is typically determined empirically.

The bit line voltage $V_{BL}$ at which each bit in the representative portion became programmed is registered and the bit line voltage $V_{BL1}$ of the fastest bit of the group is stored (step 102). FIG. 13A graphs the bit line voltage $V_{BL}$ (in number of steps) and the number of bits that became programmed at that level. In the example of FIG. 13A, two bits became programmed at level 6, five at level 7, eight at level 8 and 4 at level 9.

Level 6 is the lowest programming level and is thus, the bit line voltage $V_{BL1}$ of the fastest bits (i.e. the bits programmed in six, rather than seven, eight or nine, steps). Thus, as Applicants have realized, all bits of the representative portion could begin the programming procedure at level 6. In such a case, the fastest bits would be programmed in one step while the others would be programmed in two, three or four steps.

Since the portion was only a representative portion and the array could include bits that program even faster, in step 104, the dial-in level DI is set to X levels lower than the fastest bit line voltage $V_{BL1}$, where X can be any reasonable margin, such as two or three levels. FIG. 13A shows (with arrow 106) setting the dial-in level DI to two levels lower than the stored bit line voltage $V_{BL1}$.

The rest of the array is now programmed (step 108), starting at the dial-in level DI. FIGS. 13B, 13C, 13D and 13E show four possible results. Since, in the four figures, the programming procedure begins at the dial-in level (the fourth original programming level), the first programming level in FIGS. 13B–13E is aligned with the fourth programming level of FIG. 13A. For all figures, the new bit line voltage $V_{BL2}$ of the fastest bit is found in step 110.

Figure 13D:
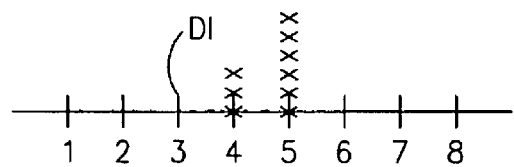

In FIG. 13B, the fastest bits are as fast as the fastest ones in the representative portion and thus, program at the third programming level (which is equivalent to the old sixth programming level). In FIG. 13C the fastest bits program in two steps, and thus, are faster than those in the representative portion. In both cases, the dial-in level DI is changed (step 112) to the fastest bit line voltage $V_{BL2}$. In FIG. 13D, however, the fastest level is above the third programming level (as checked in step 114), meaning that the fastest bits in the remainder of the array are slower than those of the representative portion. In this case, the dial-in level DI is kept at the first fast programming level, $V_{BL1}$.

Figure 13E:
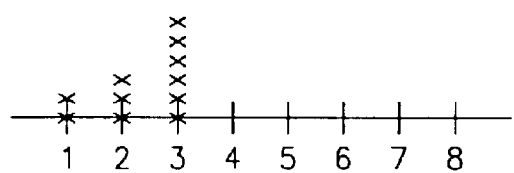

In FIG. 13E, the fastest programming level is the first one. This situation is inconclusive. It is possible that the fastest bit can program at an even lower programming level. The system now has a choice (steps 114 and 115); it can set the dial-in level DI to this first programming level, it can repeat the whole process from step 104, setting the preliminary dial-in level DI to lower than this level was previously, or it can decide to fail the part.

For the remaining situations (i.e. all but that of FIG. 13E), the dial-in level DI is modified (step 112) to the either $V_{BL1}$ or $V_{BL2}$, whichever is lowest. If desired, DI may be set to a lower level since the conditions during the test are not likely to match the expected conditions of operation. For example, the test may be performed at a fixed temperature while the product may be operated at lower or higher temperatures.

FIGS. 13B, 13C and 13D show that, by beginning the programming levels at a higher level than that of the original of FIG. 13A, the number of programming steps and thus, the programming time, is reduced. It should be noted that the first original steps cannot be omitted since, in some cases, the dial-in level DI may fall on the initial steps.

In step 113 (FIG. 12), the dial-in level DI is set to Y levels lower than the level set in step 112, where Y can be any reasonable margin to accommodate for temperature and cycling. For example, Y can be one or two levels below the value found in step 112.

It will be appreciated that other methods of finding an initial dial-in level which ensure that the first programming level is close to the programming level of the fastest bit of the array are possible and are incorporated into the present invention. For example, the entire array can be programmed and the fastest programming level chosen. Alternatively, a two stage method such as described above can be performed but the second stage can be performed on the entire array rather than all but the representative portion.

Furthermore, the operation described hereinabove can be performed at other times during the life of the array, such as when so instructed by a user or by automatic built-in procedures.

Finally, occasionally it might be desired to determine the dial-in level DI quickly or roughly. In this case, only the representative portion is utilized and the dial-in level DI is set to the first fastest programming level $V_{BL1}$ or, if desired, even higher. This choice may be adequate if fast programming is required.

It will be appreciated that the method of changing the dial-in level generally improves yield since the initial programming pulses that hardly change the state of the bits are eliminated. Each programming pulse above the dial-in level is generally more effective and thus, most of the bits will not fail to program (a cause of reduced yield).

Figure 14A:
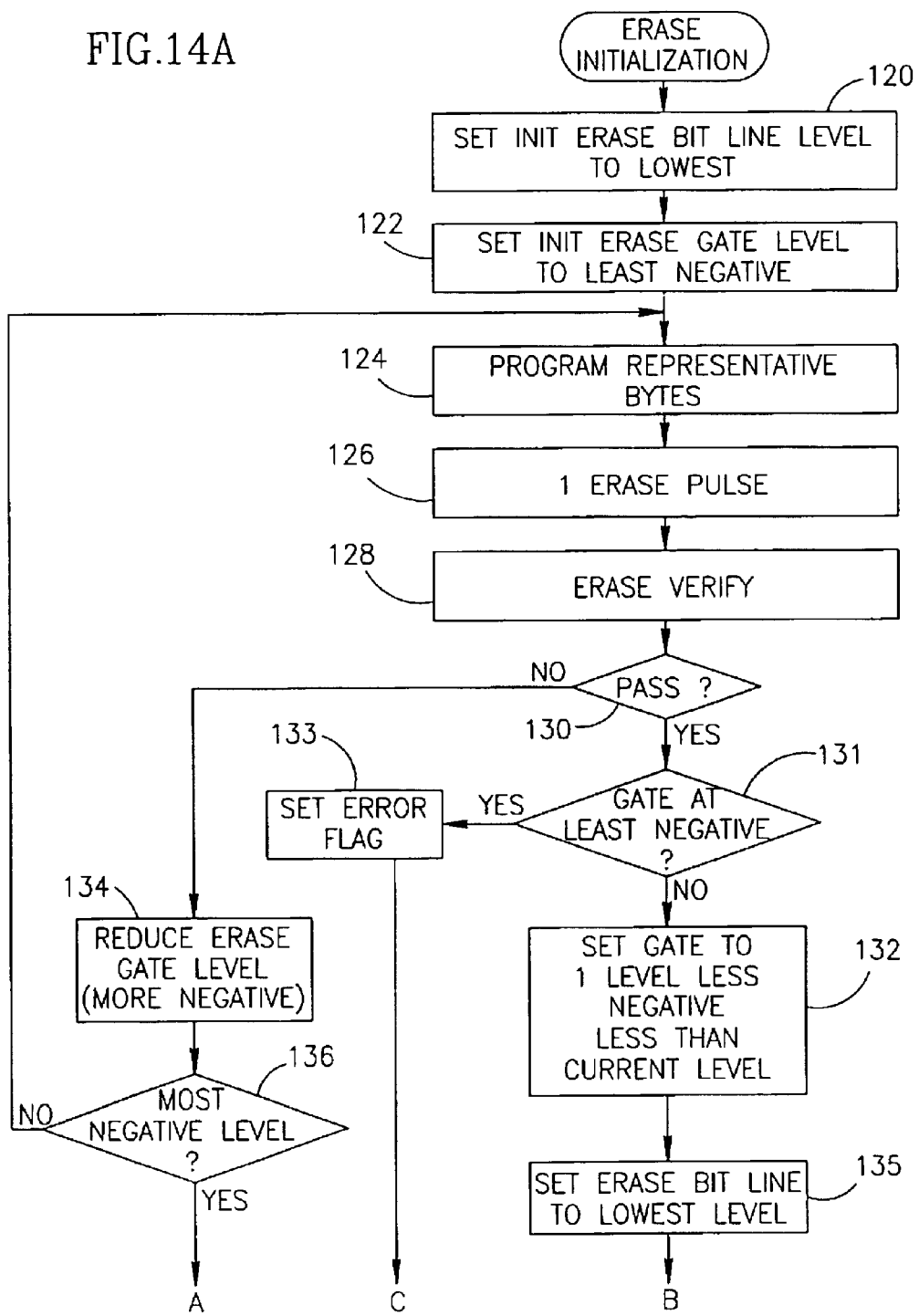
FIGS. 14A and 14B together are a flow chart illustration of a method of setting an initial erase voltage level, operative in accordance with a preferred embodiment of the present invention.
Figure 14B:
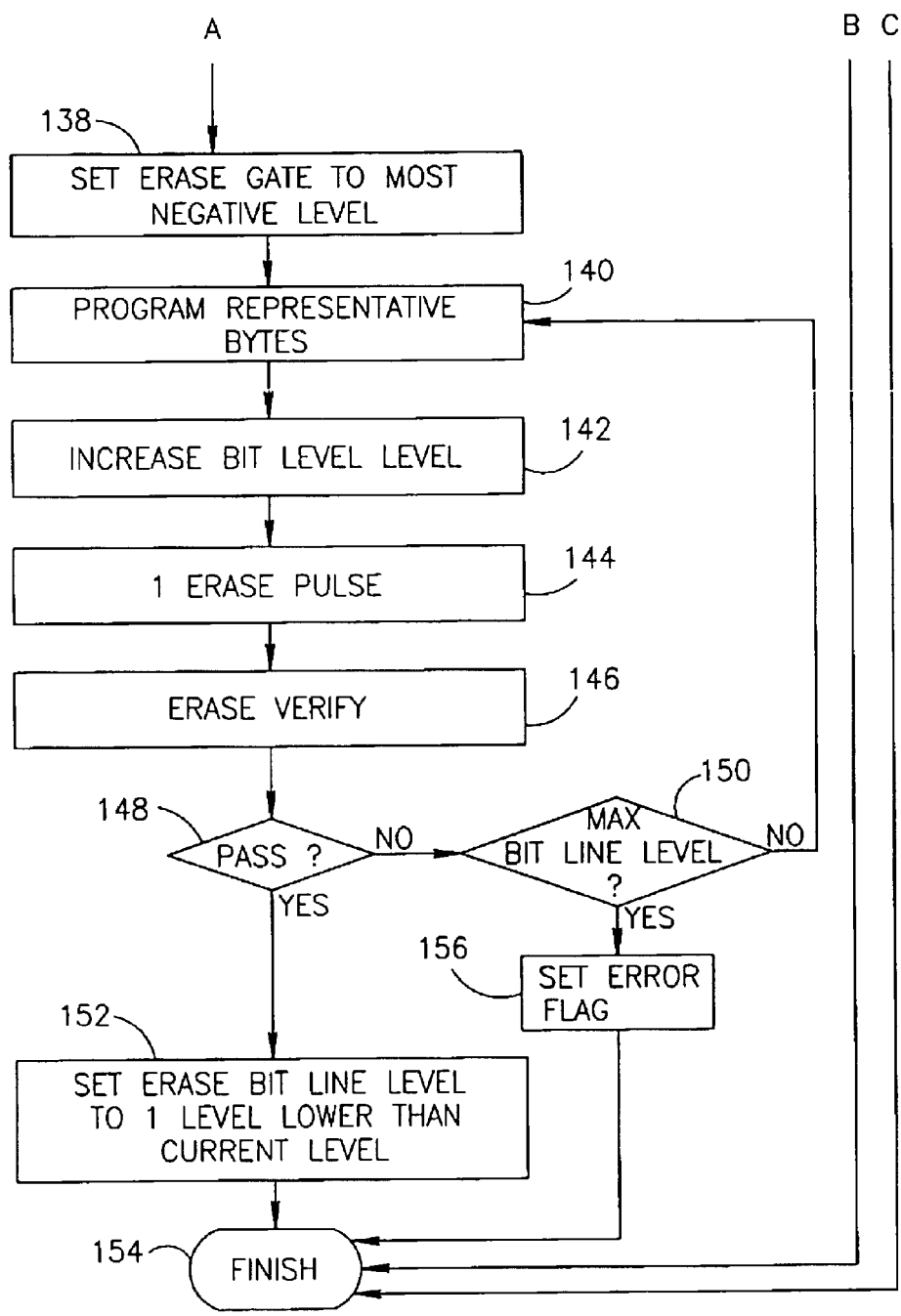

It will be appreciated that the method of changing the dial-in level, described hereinabove for programming, may also be utilized for erasing. Reference is now made to FIGS. 14A and 14B which, together, illustrate an exemplary method for dial-in for erasure. The basic method is similar to that of programming except that, in erasure, both the gate and the drain voltage levels may be set. This is shown in FIGS. 14. Alternatively, only the drain voltage level can be set.

Furthermore, only the representative portion is considered. In one embodiment, the dial-in level DI of the gate or the drain is then set to a voltage level slightly below the voltage level of the slowest bit (to force the erase procedure to perform at least two erase pulses).

In step 120, the drain voltage Vppd is set to its lowest level for erasure. In step 122, the gate voltage level is set to the least negative voltage possible for erasure.

In step 124, one or more representative bytes are programmed and, in step 126, a single erase pulse is provided. An erase verify operation is performed in step 128 and the results checked in step 130.

If all of the bits which were programmed are now fully erased (i.e. the erase is fully verified), then either this occurred after the first loop (i.e. the gate is at its least negative level) or it occurred at some other point. This is checked in step 131. If the erasure occurred after the first loop (through steps 124–130), then the process was too successful and an error flag is set (step 133). Either the array can then be thrown away or the length of the erase pulse can be shortened and the process repeated.

If erasure is successful with a somewhat lower gate voltage, the gate voltage level for dial-in is set (step 132), as is the drain voltage Vppd for dial-in (step 135), and the process finishes in step 154. In one embodiment, the gate voltage level for dial-in can be set to one level less negative than the current level. Other embodiments include setting the gate voltage for dial-in to the level found in this process or for setting it to Z levels less negative than the current level.

If the erase verify (of step 130) was not successful, the gate voltage level is made more negative (step 134). As long as the gate voltage has not reached its most negative level (checked in step 136), the process of steps 124 through 130 is repeated with the new gate voltage level.

If the gate voltage has reached its most negative level without successfully erasing all of the programmed bits, then the process continues with steps 138–148 by changing the drain voltage level. The gate level is set at this point to its most negative voltage level.

In step 138, the gate voltage is set to its most negative level. As in the previous section, in step 140, one or more representative bytes are programmed. However, in this section, the drain voltage is raised (step 142), after which, in step 144, a single erase pulse is provided. An erase verify operation is performed in step 146 and the results checked in step 148.

If the all of the bits are now erased, the drain voltage Vppd for dial-in is set (step 152) and the process finished (step 154). As for the gate level, in one embodiment, the drain voltage Vppd for dial-in can be set to one level lower than the current level. Other embodiments include setting the drain voltage for dial-in to the level found in this process or for setting it to Z1 levels lower than the current level.

If the bits are not yet fully erased, the process of steps 140–148 is repeated until a maximum drain voltage is reached, as checked by step 150. If the maximum drain voltage is reached and the bits have not been erased, then the array cannot be erased in one pulse. An error flag is set (step 156) and the process finished. At this point, the array may either be thrown away, the process of FIGS. 14 may be repeated using two or more erase pulses in steps 126 and 144 or the duration of the erase pulse may be made longer.

As mentioned hereinabove, the dial-in level may also be determined by changing only the drain voltage Vppd (i.e. steps 120, 122 and 138–152).

Even with the dial-in level described hereinabove with respect to FIGS. 12, 13 and 14, some of the bits may still take many programming or erase pulses before becoming programmed or erased, respectively, and the number of pulses needed may vary depending on operating conditions.

Figure 15:
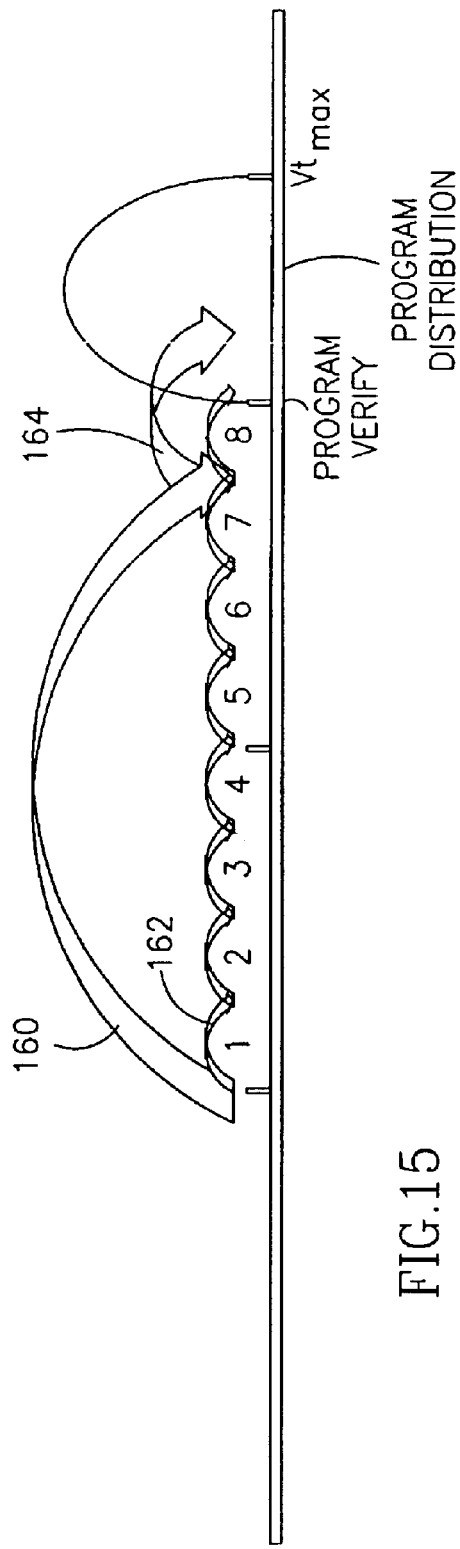
FIG. 15 is a schematic illustration showing two programming schedules for two different bits.
Figure 16:
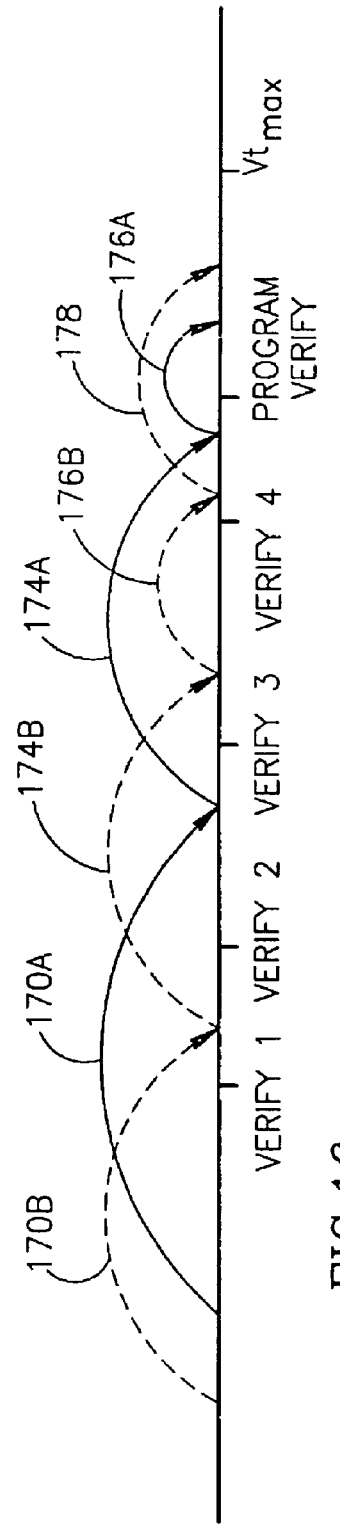
FIG. 16 is a schematic illustration of an alternative embodiment of the present invention having multiple verify levels during programming.

Typically, the bit line programming levels increase in voltage by predetermined amounts. Reference is now made to FIGS. 15 and 16 which illustrate a further embodiment of the present invention which changes the incremental voltage level of the drain Vppd between pulses in order to program most of the bits in as few programming steps as possible. As described hereinbelow, the incremental voltage level is adapted to the current response of the bit to programming pulse.

Bits respond to programming in different ways. When given a programming pulse, the threshold voltage of some may increase significantly (see arrow 160 of FIG. 15) while the threshold voltage of others may only increase slightly (see arrow 162). The former bit requires only one more programming pulse (arrow 164) until it becomes programmed (i.e. until its threshold voltage is larger than a "program verify" voltage level). The latter type of bit must have multiple programming pulses (labeled 1–8) until it becomes programmed.

A bit that takes a significant number of programming pulses takes a long time to program and may limit the overall product performance. Applicants have realized that, if the threshold voltage level after a programming pulse is measured, it is possible to adjust the voltage level increment of the next programming pulse to move the threshold level toward the program verify level more quickly. This is illustrated in FIG. 16 in which multiple verify levels, labeled verify 1, verify 2, verify 3 and verify 4, are shown. It will be appreciated that the present invention includes having multiple verify levels and that the four levels are shown for purposes of clarity only. The number of verify levels is a design choice and any number greater than one is included in the present invention. It will also be appreciated that existing reference levels in the array can be used to provide the multiple verify levels.

During the program verify operation, after a programming pulse, the threshold voltage level of the bit is compared to five voltage levels, that of verify 1, verify 2, verify 3, verify 4 and program verify to determine how close to fully programmed the bit is.

Consider the two bits shown in FIG. 16 (the first one with solid lines and the second one with dashed lines). In the first example, the first programming pulse brings the threshold voltage level of the first bit almost to the verify 3 level (this pulse is labeled 170A). The output of the comparisons will be that the threshold voltage level is above the verify 1 and verify 2 levels but not above the verify 3, verify 4 and program verify levels. The threshold level of the bit is thus above the verify 2 level.

For the second bit, the first programming pulse (here labeled 170B) brings the threshold voltage level to above the verify 1 level. Only the verify 1 comparison will indicate that the threshold level is above it; all the remaining comparisons will be that the threshold level of the bit is below the comparison level. Thus, the threshold level for the second exemplary bit is above the verify 1 level.

It will be appreciated that the comparison operations can be performed together or serially. If performed serially, from the program verify level down to the verify 1 level, then the comparison operation ends once the threshold level of the bit is above the current comparison level.

Typically, a group of bits, such as a byte, are programmed together. The verify operation described hereinabove is performed for the group of bits and the bit having the highest verify level is then used to determine the size of the next programming pulse.

Each verify level has a different voltage level increment associated therewith, depending on how far away the verify level is from the program verify level. The closer the verify level is to the program verify level, the smaller the increment to the drain voltage Vppd. The size of the increment depends on the average transfer function between the change $\Delta V_{PPD}$ in bit line voltage and the resultant change $\Delta V_T$ in threshold level and is typically determined by experimentation. In addition to depending on the change $\Delta V_{PPD}$, it can also depend on the level of the bit line voltage itself.

In one example, the verify 4 level is 250 mV less than the program verify level. For this example, the increment in bit line voltage level, $\Delta V_{PPD}$, for a bit which is above the verify 4 level but below the program verify level is be about 300 mV. Table 1 gives an example of voltage levels for the verify levels and their associated incremental voltage levels for the example of FIG. 16.

TABLE 1

| Verify Name | How much the reference level is less than the program verify Level (mV) | $\Delta V_{PPD}$ (mV) |
|---|---|---|
| Program Verify | 0 | 0 |
| Verify 4 | −250 | 300 |
| Verify 3 | −500 | 600 |
| Verify 2 | −750 | 900 |
| Verify 1 | −1000 | 1200 |

It will be appreciated that the size of the increment is a tradeoff. If the minimum number of programming pulses is required, then the increment should be designed to bring a bit to fully programmed from whatever threshold voltage level it is at. Alternatively, if a minimum amount of over-programming is desired, then the increment should be designed to bring a bit to just under the program verify level. The latter method requires that a further small increment programming pulse be performed in order to bring the bit above the program verify level. However, the latter method generally will not overprogram the bits.

The process is repeated until one or more bits are fully programmed, at which point they no longer receive programming pulses. The bit with the next highest threshold level defines the increment for the next programming pulse. FIG. 16 shows this process. The first programming pulse 170 brought the first bit to above the verify 2 level, so the voltage level of the second programming pulse 174 is set to be large enough to bring the first bit to the program verify level. In this case, the second pulse was not quite large enough (arrow 174A does not quite reach the program verify level) and a third pulse 176 was necessary (arrow 176A is above the program verify level).

For the second bit, second pulse 174 brings the threshold level above the verify 3 level (arrow 174B) and the third pulse brings the threshold level above the verify 4 level (arrow 176B). At this point, the second bit is the highest bit and its verify 4 level defines the increment for the fourth programming pulse, labeled 178, after which the second bit is fully programmed.

Figure 17:
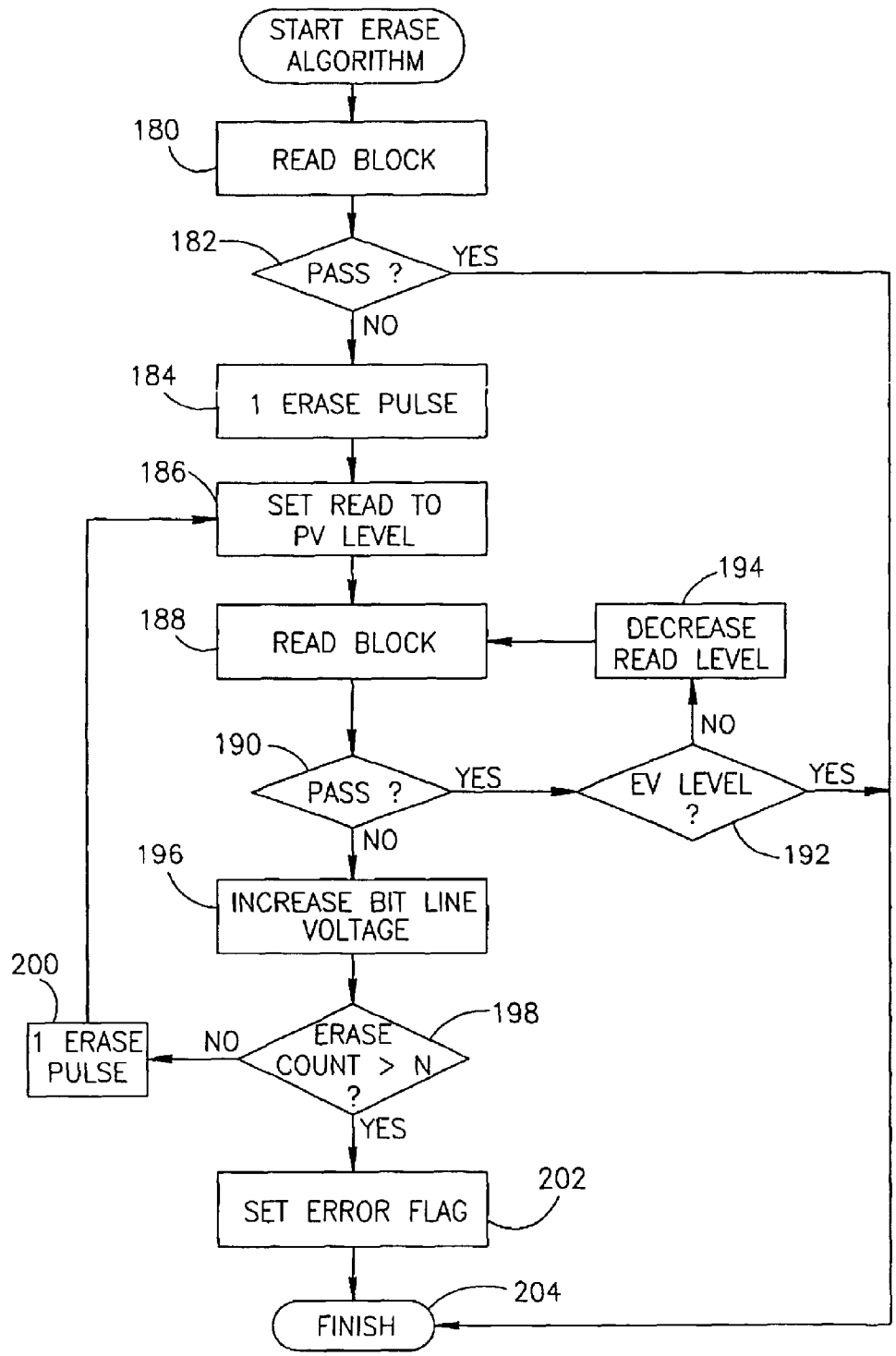
FIG. 17 is a flow chart illustration of a method of generally fast erasing using multiple verify levels.

It will be appreciated that the present invention can also be utilized for erasure, as shown in FIG. 17, to which reference is now made.

Reference is now made to FIG. 17, which illustrates an exemplary method for multiple pulse erasure. In step 180, the block to be erased is read and, in step 182, its erase state is checked. If all of the bits of the block are erased already, the process is finished (step 204).

If the block requires further erasure, an erase pulse is provided (step 184), typically with predefined gate and drain voltages, such as those defined in the dial-in process of FIG. 14. Other predefined gate and drain voltages are also possible.

In steps 186–194, the read level is decreased from the program verify level (i.e. the level of fully programmed bits) towards the erase verify level (i.e. fully erased) to determine how much erasure has occurred and how much more needs to occur.

Specifically, in step 186, the read voltage level is set to the program verify (PV) level and the block is read (step 188). If all of the bits of the block pass the read operation, as checked in step 190, the read voltage level is reduced (step 194) as long as it has not yet reached the erase verify level (as checked in step 192).

If the read operation is successful at the erase verify level, then the block has been fully erased and the process finishes in step 204. However, if the read operation fails at some point, the drain voltage level Vppd is increased (step 196), for example according to Table 2, another erase pulse is provided (step 200) using the new drain voltage level Vppd and the process is repeated from step 186. Step 198 checks that the number of erase pulses has not exceeded a maximum. If it has, then an error flag is set (step 202) and the process is stopped (step 204).

TABLE 2

| Verify Name | Reference Level above the Erase Verify Level (mV) | $\Delta V_{PPD}$ (mV) |
|---|---|---|
| Program Verify | 950 | +1000 |
| Verify 2 | 700 | +750 |
| Verify 1 | 400 | +500 |
| Erase Verify | 0 | 0 |

It is noted that Table 2 has only four verify levels while Table 1, for programming, has five verify levels. The number of verify levels are set by a designer according to any appropriate set of design considerations.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described herein above. Rather the scope of the invention is defined by the claims that follow.

What is claimed is:

1. A method for programming a memory array, the method using programming pulses applied to either the drain or gate of one or more memory cells within said memory array, the method comprising:

adapting the duration or the amplitude of said programming pulses as a function of the difference between a present state of the one or more memory cells and a target state of the one or more memory cells, wherein the amplitude or duration of the programming pulses are correlated to the difference between a present state of the one or more memory cells and a target state of the one or more memory cells.

2. A method according to claim 1 wherein said step of adapting includes:

determining the voltage level of the programming pulse used to program a fast bit of said memory array having a relatively faster programming characteristic than other bits in said array; and setting an initial programming pulse voltage level to a level near said programming pulse voltage level of said fast bit.

3. A method according to claim 2 and wherein said step of determining includes:

programming a small set of bits of said memory array;

setting a starting programming pulse voltage level to a programming pulse voltage level not higher than a programming pulse voltage level used to program a fast bit of said small set having a relatively faster programming characteristic than other bits in said small set;

programming generally all of the bits of said memory array using pulses having voltage levels beginning at said staring programming pulse voltage level; and setting said initial programming pulse voltage level to a programming pulse level near a programming pulse voltage level used to program a bit having a relatively faster programming characteristic than generally all other bits of said array.

4. A method according to claim 2 wherein said initial programming pulse voltage level is not higher than said programming pulse level of said fast bit.

5. A method according to claim 3 wherein said generally all of bits of said array does not include bits of said small set.

6. A method according to claim 3 wherein said generally all of bits of said array does include bits of said small array.

7. A method according to claim 1 and wherein said step of adapting includes the steps of:

measuring the current threshold level of a bit to within a predetermined range; and selecting an incremental voltage level of a next programming pulse for said bit in accordance with said measured current threshold level.

8. A method according to claim 7 and wherein said step of measuring includes the step of having multiple verify levels for said array.

9. A method according to claim 8 and wherein said step of measuring also includes the step of after a programming pulse, comparing a threshold level of a group of bits which have received said programming pulse to at least one of said verify levels and said step of selecting includes the step of selecting a next programming pulse level according to generally the highest verify level achieved by said group.

10. A method according to claim 9 and also comprising the steps of removing any bit which has been programmed from said group and repeating said steps of comparing and selecting until there are no more bits in said group.

11. A method according to claim 8 and wherein said step of measuring also includes the step of after a programming pulse, comparing a threshold level of a bit which received said programming pulse to at least one of said verify levels and said step of selecting includes the step of selecting a next programming pulse level according to generally the highest verify level achieved by said bit.

12. A method according to claim 7 and wherein the magnitude of said incremental voltage level corresponds to said measured current threshold level such that, after programming with said incremental voltage level, said bit generally is fully programmed.

13. A method according to claim 7 and wherein the magnitude of said incremental voltage level corresponds to said measured current threshold level such that, after programming with said incremental voltage level, said bit generally is slightly less than fully programmed.

14. A method according to claim 13 and also comprising the step of final programming said bit with a small incremental voltage level after said step of programming with said incremental voltage level.

* * * * *